United States Patent
Zhai et al.

(10) Patent No.: US 10,466,318 B2
(45) Date of Patent: Nov. 5, 2019

(54) MAGNETIC RESONANCE VOLUME COIL WITH MULTIPLE INDEPENDENT TRANSMIT RECEIVE CHANNELS AND METHOD OF OPERATION THEREOF

(71) Applicant: KONINKLIJKE PHILIPS N.V., Eindhoven (NL)

(72) Inventors: Zhiyong Zhai, Eindhoven (NL); Michael Andrew Morich, Eindhoven (NL)

(73) Assignee: Koninklijke Philips N.V., Eindhoven (NL)

(*) Notice: Subject to any disclaimer, the term of this patent is extended or adjusted under 35 U.S.C. 154(b) by 118 days.

(21) Appl. No.: 15/559,089

(22) PCT Filed: Mar. 28, 2016

(86) PCT No.: PCT/IB2016/051743
§ 371 (c)(1),
(2) Date: Sep. 18, 2017

(87) PCT Pub. No.: WO2016/157063
PCT Pub. Date: Oct. 6, 2016

(65) Prior Publication Data
US 2018/0246179 A1    Aug. 30, 2018

Related U.S. Application Data

(60) Provisional application No. 62/139,030, filed on Mar. 27, 2015.

(51) Int. Cl.
*G01R 33/34* (2006.01)
*G01R 33/36* (2006.01)
(Continued)

(52) U.S. Cl.
CPC . *G01R 33/34053* (2013.01); *G01R 33/34076* (2013.01); *G01R 33/3678* (2013.01); *G01R 33/3875* (2013.01); *G01R 33/5659* (2013.01)

(58) Field of Classification Search
CPC ........ G01R 33/34053; G01R 33/34076; G01R 33/3678; G01R 33/3875; G01R 33/5659
See application file for complete search history.

(56) References Cited

U.S. PATENT DOCUMENTS 6,313,633 B1  11/2001  Boskamp
6,522,143 B1  2/2003  Fujita et al.
(Continued)

FOREIGN PATENT DOCUMENTS

JP   05261082 A     10/1993
WO   2005122890 A1  12/2005

OTHER PUBLICATIONS

Zhai et al "7T Head Coil With Two Independent T/R Channels" Proceedings of the International Society for Magnetic Resonance in Medicine Jun. 5, 2015, No. 1801, p. 1801.

*Primary Examiner* — Rodney A Bonnette

(57) ABSTRACT

A magnetic resonance (MR) system includes a volume-type radio-frequency (RF) coil assembly having a volume coil with a plurality of ports and a ring coil with a plurality of ports (p') and which is situated about the volume-type coil. At least one controller is configured to selectively control a first transmit/receive (T/R) radio frequency (RF) channel to generate an output including RF quadrature signals to drive the volume-type coil and to selectively control a second T/R RF channel to generate an output including RF quadrature signals to drive the ring coil.

19 Claims, 10 Drawing Sheets

(51) Int. Cl.
    *G01R 33/565*     (2006.01)
    *G01R 33/3875*     (2006.01)

(56)         References Cited

U.S. PATENT DOCUMENTS

| | | |
|---|---|---|
| 7,397,243 B1 | 7/2008 | Baulkes et al. |
| 8,089,281 B2 | 1/2012 | Zhai et al. |
| 8,421,462 B2 | 4/2013 | Zhai et al. |
| 2002/0149367 A1 | 10/2002 | Boskamp et al. |
| 2003/0184298 A1 | 10/2003 | Heid et al. |
| 2010/0013483 A1 | 1/2010 | Odintsov |
| 2010/0026303 A1 | 2/2010 | Zhai et al. |
| 2015/0241539 A1* | 8/2015 | Kaneko .................. A61B 5/055 324/307 |
| 2018/0113180 A1* | 4/2018 | Ishi ...................... G01R 33/246 |

\* cited by examiner

MAGNETIC RESONANCE VOLUME COIL WITH MULTIPLE INDEPENDENT TRANSMIT RECEIVE CHANNELS AND METHOD OF OPERATION THEREOF

CROSS REFERENCE TO RELATED APPLICATIONS

This application is a U.S. national phase application of International Application No. PCT/IB2016/051743, filed on Mar. 28, 2016, which claims the benefit of U.S. provisional Application Ser. No. 62/139,030 filed on Mar. 27, 2015 and is incorporated herein by reference.

The present system relates to a radio frequency (RF) volume coil for magnetic resonance (MR) imaging (MRI) and spectroscopy (MRS) systems and, more particularly, to an ultra-high-field RF volume coil with enhanced transverse RF magnetic ($B_1^+$) field uniformity and $B_1^+$ shimming capability, and a method of operation thereof.

Recently, ultra-high-field MRI systems have become commercially available for research purposes at the present time. Unfortunately, at ultra-high fields such as 7T and above, $B_1^+$ fields generated by conventional MRI systems RF transmit coils are increasingly non-uniform due to an increase in dielectric (wavelength) effect. Although, multiple-element transmit/receive (T/R) surface coils arranged to cover a volume of interest and with multiple T/R channels can be used in an effort to improve the uniformity of the $B_1^+$ field (e.g., $B_1^+$ uniformity), this approach is technically complex and suffers from low power efficiency. Accordingly, embodiments of the present system may overcome these and other disadvantages of conventional ultra-high-field MRI and MRS systems.

The system(s), device(s), method(s), arrangements(s), user interface(s), computer program(s), processes, etc. (hereinafter each of which will be referred to as system, unless the context indicates otherwise), described herein address problems in prior art systems.

In accordance with embodiments of the present system, there is disclosed a radio-frequency (RF) coil apparatus for magnetic resonance (MR) systems, the RF coil may include one or more of: a ring coil including a loop having an opening and defining a radial axis; a volume coil having opposed ends defining a length ($L_{VC}$) and extending through the opening of the ring coil; and a shield situated about the ring coil and the volume coil. Wherein the volume coil may include end coils each situated at one of the opposed ends and each including a loop defining a radial axis and having a plurality of coupled conductive segments, the end coils being substantially parallel with each other and aligned so that the radial axis of each of the end coils may define a common axis ($A_X$). At least one of the opposed end coils may include a plurality of ports (p) for receiving a first set of quadrature drive signals (e.g., (S0° and S90°) or (S0°, S90°, S180°, and S270°)). The volume coil may further include a plurality of rungs each substantially parallel with each other and coupled to the opposed end coils. The ring coil may include a plurality of ports (p') for receiving a second set of quadrature drive signals (e.g., (S'0° and S'90°; or (S'0°, S'90°', S'180°', and S'270°')) and may be formed from a plurality of conductive segments (132) capacitively coupled to each other.

It is further envisioned that each of the end coils and the ring coils may have a substantially similar reactance. Each of the end coils and ring coils may include a same number of conductive segments. In accordance with embodiments of the present system, the plurality of ports of the ring coil comprises two or four ports (p') each spatially distributed 90 degrees apart from each other about the radial axis of the ring coil. It is also envisioned that the ring coil may be situated at a point which is substantially equidistant from the end coils at a mid-plane.

It is further envisioned that the apparatus may further include an RF controller including at least one controller which generates the first set of quadrature drive signals (e.g., (S0° and S90°; or (S0°, S90°, S180°, and S270°)) and the second set of quadrature drive signals (e.g., (S'0° and S'90°); or (S'0°, S'90°, S'180°', and S'270°')). In accordance with embodiments of the present system, the RF controller may further control at least one of amplitude and phase of each of the first set of quadrature drive signals to perform $B_1^+$ shimming. It is also envisioned that each of the quadrature drive signals may be generated by a corresponding independent transmit/receive (T/R) channel of a plurality of independent T/R channels, and, wherein at least three of the independent T/R channels of the plurality of independent T/R channels may be controlled to perform $B_1^+$ shimming. In accordance with embodiments of the present system, each of the quadrature drive signals may be generated by a corresponding independent transmit/receive (T/R) channel of a plurality of independent T/R channels, and wherein four of the independent T/R channels of the plurality of independent T/R channels may be controlled to perform $B_1^+$ shimming.

In accordance with embodiments of the present system, there is disclosed a magnetic resonance (MR) system which may include one or more of a volume-type radio-frequency (RF) coil assembly having a volume coil with a plurality of ports (p) and a ring coil with a plurality of ports (p') and being situated about the volume-type coil; and at least one controller which may selectively control a first transmit/receive (T/R) radio frequency (RF) channel (CH1) to generate an output including RF quadrature signals (S0°, S90°, S180°, S270°) to drive the volume-type coil and to selectively control a second T/R RF channel to generate an output including RF quadrature signals (S'0°, S'90°, S'180°, S'270° to drive the ring coil.

In accordance with embodiments of the present system, the volume coil and the ring coil may be configured to be driven independently of each other. Further, the at least one controller may perform $B_1^+$ shimming by controlling the outputs of first and second T/R RF channels relative to each other. It is further envisioned that the at least one controller may perform $B_1^+$ shimming by varying at least one of amplitude and phase of the RF quadrature signals of the selectively controlled first and second T/R RF channels. Moreover, the at least one controller may performs a multi-transmit pre-scan operation to determine $B_1^+$ shimming settings.

In accordance with embodiments of the present system, the at least one controller may vary at least one of the amplitude and phase of the RF quadrature signals of the first and second T/R RF channels in accordance with the $B_1^+$ shimming settings. It is also envisioned that the RF quadrature signals for each channel of the first and second T/R RF channels respectively may include first through fourth signals each with a progressive phase shift.

In accordance with embodiments of the present system, a method of operating a radio-frequency (RF) coil of a magnetic resonance (MR) system (100, 600, 700, and 1300) is disclosed, where the method is performed by at least one controller (110) of the MR system and comprises an act of driving a volume-type radio-frequency (RF) coil assembly (221) having a volume coil (122) with a plurality of ports (p)

and a ring coil (124) with a plurality of ports (p') and which is situated about the volume-type coil by (1) selectively controlling a first transmit/receive (T/R) radio frequency (RF) channel (CH1) to generate an output comprising a first set of RF quadrature signals (S0°, S90°, S180°, S270°) and providing the generated first set of RF quadrature signals to the plurality of ports (p) of the volume-type coil; and (2) selectively controlling a second T/R RF channel to generate an output comprising a second set of RF quadrature signals (S'0°, S'90°, S'180°, S'270°) and providing the generated second set of RF quadrature signals to the plurality of ports (p') of the ring coil. The volume coil and the ring coil are configured to be driven independently of each other. Further, the at least one controller performs $B_1^+$ shimming by controlling the outputs of first and second T/R RF channels relative to each other. Alternatively or in addition, the at least one controller performs $B_1^+$ shimming by varying at least one of amplitude and phase of the RF quadrature signals of the selectively controlled first and second T/R RF channels.

The present invention is explained in further detail in the following exemplary embodiments and with reference to the figures, where identical or similar elements are partly indicated by the same or similar reference numerals, and the features of various exemplary embodiments being combinable. In the drawings.

The following are descriptions of illustrative embodiments that when taken in conjunction with the following drawings will demonstrate the above noted features and advantages, as well as further ones. In the following description, for purposes of explanation rather than limitation, illustrative details are set forth such as architecture, interfaces, techniques, element attributes, etc. However, it will be apparent to those of ordinary skill in the art that other embodiments that depart from these details would still be understood to be within the scope of the appended claims. Moreover, for the purpose of clarity, detailed descriptions of well-known devices, circuits, tools, techniques, and methods are omitted so as not to obscure the description of the present system. It should be expressly understood that the drawings are included for illustrative purposes and do not represent the entire scope of the present system. In the accompanying drawings, like reference numbers in different drawings may designate similar elements.

Figure 1:
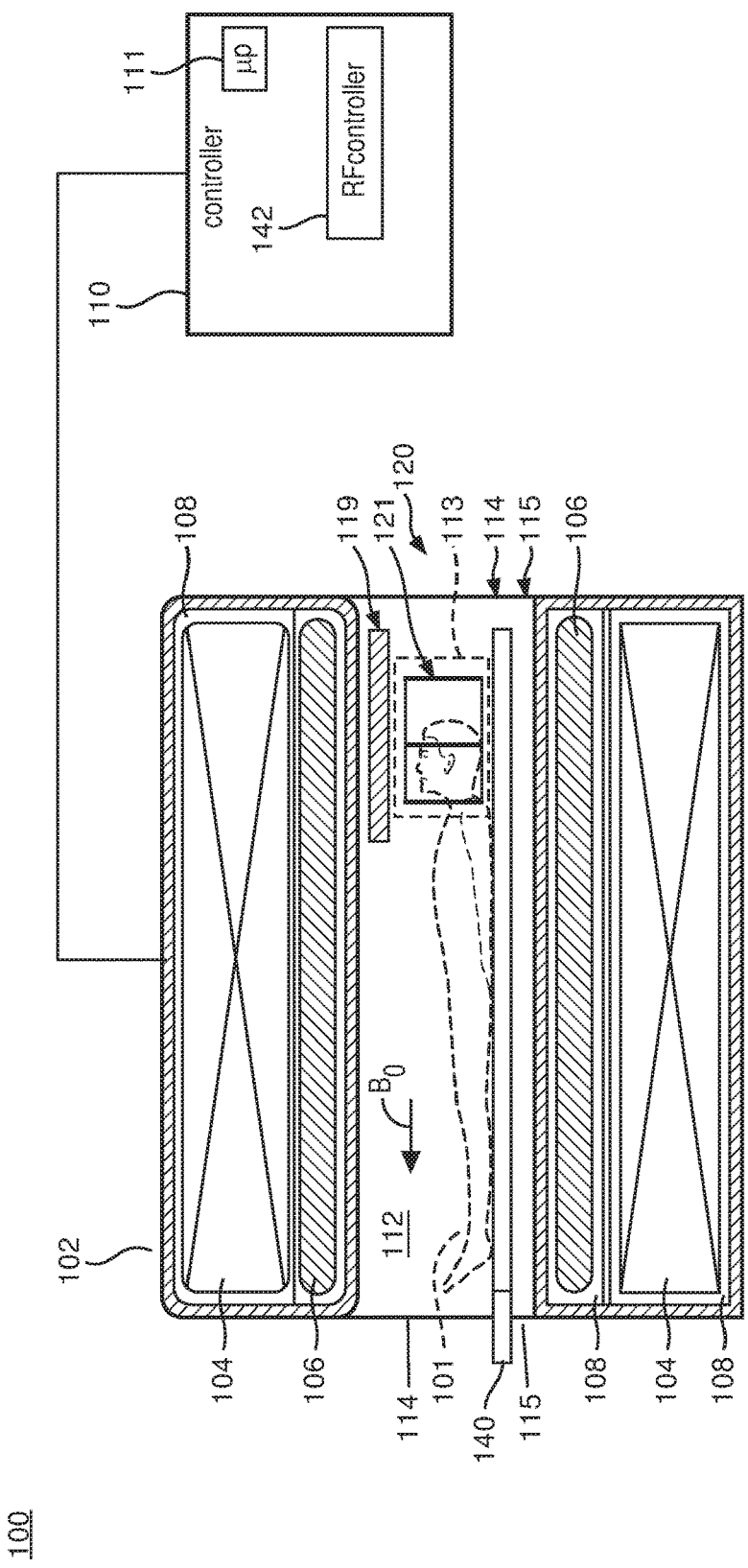
FIG. 1 shows a partially cutaway side view of a portion of an MR system operating in accordance with embodiments of the present system.

FIG. 1 shows a partially cutaway side view of a portion of an MR system 100 (hereinafter system 100 for the sake of clarity) operating in accordance with embodiments of the present system. The system 100 may include one or more of a controller 110, a memory, a user interface (UI), a body 102, a main magnet 104, gradient coils 106, and an RF portion 120. A patient support 140 may be provided to support an object-of-interest (OOI) for scanning, such as a subject or patient 101 (e.g., a human subject or human patient, an animal, etc.), and/or to position the OOI such as the patient 101 in a desired position and/or orientation in relation to the body 102 under the control of the controller 110. For example, the patient support 140 may be controlled to position the OOI and/or portions of the RF portion 120 within a scanning volume 113.

The body 102 may include at least one cavity 108 and a main bore 112 situated between opposed ends 114 of the body 102. The main bore 112 may be situated between opposed openings 115 of the body 102 and may be configured to receive the OOI such as the patient 101 through one of the openings 115. The at least one cavity 108 may be configured to receive one or more of the main magnet 104, the gradient coils 106, and/or a portion of the RF portion 120 (such as built-in RF coils of the RF coil portion 120). The body 102 may further include a cooling mechanism (e.g., a cryogenic cooling system, etc.) configured to cool portions of the system 100 such as the main magnet 104, the gradient coils 106, and/or the RF portion 120, as may be desired.

The controller 110 may control the overall operation of the system 100 and may include one or more logic devices such as processors (e.g., micro-processors 111, etc.) etc. The controller 110 may include one or more of a main magnet controller, a gradient controller, an RF controller 142, a system clock synchronizer (hereinafter synchronizer for the sake of clarity), a reconstructor, a scan controller, and a memory. The main magnet controller may control the operation of the main magnet 104, the gradient controller may control the operation of the gradient coils 106, the RF controller may control the operation of the RF portion 120, and the reconstructor reconstruct images, spectrographs, and/or other information based upon acquired magnetic resonance information included in an acquired RF signal from a region-of-interest (ROI) of a subject (e.g., hereinafter ARF signal for the sake of clarity).

The memory may include any suitable memory which may store data generated or otherwise used by the system 100. For example, the memory may include any suitable non-transitory memory which may be local and/or distributed, as may be desired. For example, in accordance with some embodiments, the memory may include a memory situated with an RF portion 120 which may store raw and/or reconstructed MR information for transmission to the controller 110 in a raw and/or processed format as may be desired.

The controller 110 may determine and/or otherwise obtain information related to scan settings, parameters, sequences, etc., and apply them during a corresponding scan procedure. For the sake of clarity, it will be assumed herein that the scan settings may include information related to the scan settings, scan parameters, and/or scan sequences unless the context indicates otherwise. The information related to the scan settings may be obtained from any suitable source such as the memory, from a user, and/or may be determined by the system 100. For example, the controller 110 may obtain scan settings from the memory and control, for example, the main magnet 104, the gradient coils 106 and/or the RF portion 120 accordingly. The controller 110 may include at least one controller such as a system controller and may be formed integrally with, or separately from, the body 102. For example, in some embodiments, the controller 110 may be remotely located from the body 102 and may communicate with one or more of the memory, the UI, the main magnet 104, the gradient coils 106, the RF portion 120, and/or the reconstructor via any suitable wired or wireless communication method.

The main magnet 104 may define a bore in which the main bore 112 may be situated, and may be configured to generate a main magnetic field (e.g., a $B_0$ field) within the main bore 112. The $B_0$ field may be substantially homogenous over a suitably sized volume within the main bore 112 and/or the scanning volume 113. The main magnet 104 may include one or more main magnets each configured to contribute to at least a portion of the $B_0$ field. The main magnet 104 may include any suitable annular (e.g., ring) magnet (as shown) which may form a closed configuration. The main magnet 104, or portions thereof, may be formed from any suitable material such as a superconducting material, a resistive material, etc., and/or may operate under the control of the controller 110 as discussed elsewhere. It is recognized that for whole-body scale ultra-high-field operation that superconducting material magnets are the required type.

For the sake of clarity, it will be assumed that the main magnet 104 may be a closed-type magnet (e.g., to form a closed-type MRI system 100) in which the scanning volume 113 is within the main bore 112 of the main magnet 104. However, in accordance with embodiments of the present system and without limitation, it should be assumed that the main magnet may assume other types of suitable configurations such as an open-type or split-type magnet if desired to form an open-type or split-type MRI, respectively. Further, although a horizontally orientated MRI system 100 is shown, other embodiments may include other orientations such as a horizontal and/or adjustable. It is recognized that the practicality of such alternate bore magnet embodiments may limit the operational field strength.

The gradient coils 106 may include one or more gradient coils (e.g., x-, y-, and z-gradient coils) which may produce one or more gradient fields along one or more corresponding axes (e.g., x, y, and z axes, respectively) under the control of the controller 110.

The RF coil portion 120 may include at least one RF coil which may excite and/or detect magnetic resonance in a region-of-interest (ROI) such as within the scanning volume 113 and which may operate in accordance with embodiments of the present system. For example, the RF coil portion 120 may include a volume-type RF coil portion (e.g., an enhanced birdcage-type RF coil) 121 operating in accordance with embodiments of the present system. Further, the RF coil portion 120 may include a surface-type RF coil portion 119 (e.g., a surface RF coil) operating in accordance with embodiments of the present system. Thus, the RF coil portion 120 may include surface-type and/or volume-type RF coil portions (119 and 121, respectively). However, for the sake of clarity, the present description will be drawn to a description of the volume-type RF coil portion 121 operating in accordance with embodiments of the present system. Further, it should be appreciated that a controller 110 may determine to control either or both of the RF coil portions (119 and 121), and/or portions thereof, depending upon a scan type as may be desired. Further, it should be understood that either or both of the RF coil portions (119 and 121) may operate as transmit and/or receive coils under the control of the controller 110 as may be desired. A location mechanism such as rails may be provided to adjustably control the position of the RF coil portions (119 and/or 121) so that they may be situated at various locations and/or orientations relative to the patient 101, if desired. For example, the location mechanism may control an orientation of the RF coil portion 121 so that it may be axially aligned with the $B_0$ field during use. Thus, the location mechanism may adjust location and/or orientation of the RF coil portion 121, such as via translation and rotation movements of the RF coil portion 121, so that an axis of the RF coil portion 121 may be substantially aligned with (e.g., substantially parallel to) the $B_0$ field during use as may be discussed elsewhere. With regard to the RF coil portions (119, 121), these may include wired-type and/or wireless-type RF coil portions as may be desired, wherein the wireless-type function may be for receive mode only. However, for the sake of clarity, in the present embodiments, it will be assumed that the RF coil portions (119, 121), may include wired-type RF coils.

Figure 2:
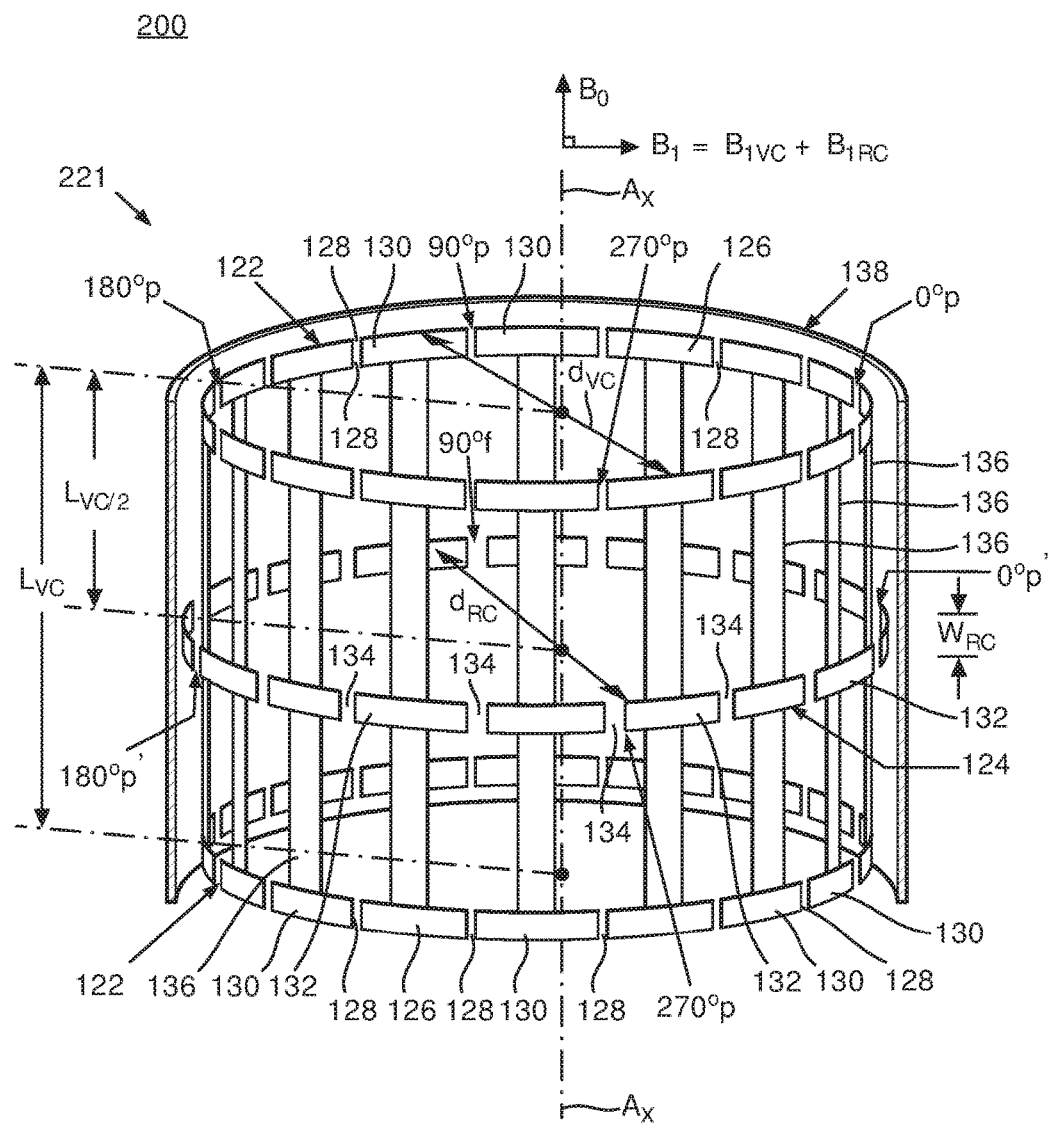
FIG. 2 shows a partially cutaway front perspective view of a volume-type RF coil portion in accordance with embodiments of the present system.

FIG. 2 shows a partially cutaway front perspective view 200 of a volume-type RF coil portion 221 (hereinafter RF coil portion 221 for the sake of clarity) in accordance with embodiments of the present system. The RF coil portion 221 may be similar to volume-type RF coil portion 121 shown in FIG. 1 and may be configured to operate as a transmit/receive volume coil which may be compatible with various frequencies and/or field strengths such as ultra-high-field MRI and MRS. The RF coil portion 221 may include one or more of a volume coil 122, a ring (e.g., field) coil 124 situated about the volume coil 122, and a shield 138 which may surround at least portions of at least one of the volume coil 122 and the ring coil 124.

The volume coil 122 may have a length $L_{vc}$ (e.g., measured from the centers of the end rings 126) and a diameter $d_{vc}$. The volume coil 122 may be similar to an enhanced birdcage-type coil operating in accordance with embodiments of the present system. The volume coil 122 may include end rings 126 each defining a radial axis ($A_{XER}$) and having a substantially circular (e.g., annular) shape. The end rings 126 may be substantially parallel and radially aligned with each other so that their radial axes ($A_{XER}$) may be commonly-shared and may be referred to as ($A_x$). The end rings 126 may or may not include reactance elements such as capacitive gaps 128 and/or discrete or distributed capacitors (hereinafter both of which may be referred to as capacitors 128 for the sake of clarity). For example, each of the end rings 126 may include a plurality of conductive segments 130 capacitively coupled together by capacitors 128 (e.g. formed by capacitive gaps in the present examples) situated between the conductive segments 130, or overlapping conductive segments with dielectric separation to yield like capacitance effect, or a combination of discrete and distributed capacitance elements may be used.

A mid-plane (e.g. a center-plane) may be defined as a plane which is substantially parallel with the planes of at least one of the end rings 126 and may be located substantially at $L_{vc}/2$. The end rings 126 may be situated apart from, and coupled to each other by a plurality of conductive spacers 136 (e.g., rungs). The spacers 136 may be substantially parallel to each other and may be coupled to, and/or formed integrally with, corresponding conductive segments 130. The spacers 136 may or may not include reactance elements such as capacitive gaps (not shown) and/or discrete capacitors and/or distributed capacitors. In accordance with embodiments of the present system, the spacers 136 may be coupled to their corresponding conductive segments 130 at a point which is substantially equidistant from the capacitors 128 at ends of the corresponding conductive segment 130. The spacers 136 and end rings 126 may physically form a volume coil 122. The volume coil 122 can be tuned to a desired resonance frequency by adjusting discrete/distributed capacitors 128 in the end rings 126 and/or discrete/distributed capacitors in spacers 136.

At least one of the end rings 126 may include N (where N is an integer greater than 2) ports ($P_n$). For example, if N=4, then one of the end rings 126 may include four ports such as port-1, port-2, port-3, and port-4 (generally port-n). Each of these ports may be spatially located about 90° apart from an adjacent port. The ports (port-n) may be located such that they may be coupled at a corresponding capacitor 128 of the corresponding end ring 126. The ports (port-n) may be identified by angular location about the opposed ring 126. Thus, port-1 through port-4 may be referred to as 0°, 90°, 180°, and 270° ports (p), respectively, for N=4. For example, if the volume coil 122 includes 2 or 4 ports, then these ports may be spatially 90°-azimuthally apart from an adjacent port or ports.

Each of the ports (port-n) may be coupled to an RF controller (e.g., 142) by corresponding signal leads (SL). Accordingly, the signal leads may provide a drive/excitation signal to a corresponding port (port-x) that causes a magnetic resonance excitation effect where a subsequent magnetic resonance signal is then received by the volume coil 122 and is provided to the RF controller 142 for further processing such as for reconstruction, etc.

An end ring 126 which includes four ports may be referred to as a four-port end ring 126. Similarly, an opposed ring which includes two ports, may be referred to as a two-port end ring.

Although both end rings 126 may include corresponding ports, for the sake of clarity, it will be assumed that only one of the end rings 126 may include the ports (e.g., ports-n).

In accordance with embodiments of the present system, the capacitors 128 may be placed along a circumference of the end rings 126 at even intervals from each other so as to be evenly spaced. For example, in accordance with some embodiments, if the total number of capacitors M=16, then these capacitors may be placed at 360 deg/(M)=360 deg/16=22.5 degree intervals. The total number of capacitors and/or capacitance of each of the end rings 126 may be substantially equal to each other.

The ring coil 124 may be formed from an annular conductive ring and may be substantially located at the mid plane of the volume coil 122. The ring coil 124 may include a diameter $d_{rc}$ which may be larger than the diameter $d_{vc}$ of the volume coil 122 so that the ring coil 124 may encircle volume coil 122. The ring coil 124 may have a width ($W_{RC}$). The ring coil 124 may be aligned with the end rings 126 such that a radial axis ($A_{XRC}$) of the ring coil 124 may be commonly shared and/or otherwise aligned with the radial axis ($A_{XER}$) of the end rings 126 to form a common axis ($A_x$). Accordingly, the radial axis of the ring coil 124 and/or the end rings 126 may be commonly referred to as ($A_x$).

The ring coil 124 may be tuned to a desired resonance frequency using any suitable method. For example, it is envisioned that the ring coil 124 may be tuned by reactance elements such as capacitive gaps 134 and/or discrete and/or distributed capacitors (hereinafter both of which may be referred to as capacitors 134 for the sake of clarity), by adjusting in the width WRC of the ring coil 124, adjusting the diameter drc of the ring coil 124 by filling a space between ring coil 124 and RF shield 138 with dielectric materials, by adding inductances in the capacitive gaps 134, and/or suitable combinations thereof. For example, the ring coil 124 may include a plurality of conductive segments 132 capacitively coupled together by capacitors 134 (e.g. formed by capacitive gaps in the present examples) situated between the conductive segments 132.

The capacitors 134 may be placed along a circumference of the ring coil 124 at evenly-spaced intervals from each other so as to be evenly distributed, as may be desired. Accordingly, the capacitors 134 may be substantially spaced evenly along the ring coil 124. Thus, if, for example, the ring coil 124 includes 16 capacitors, then they may be placed at 360 deg/(16)=360 deg/16=22.5 degree intervals. In accordance with some embodiments, the number of capacitors 134 in the ring coil 124 may be equal to the number of capacitors 128 in one of the opposed end rings 126 of the volume coil 122. In accordance with embodiments of the present system, the ring coil 124 and the volume coil 122 may be tuned to the same resonant frequency. Accordingly, the ring coil 124 may include a slightly larger or smaller diameter than the end rings 126. In the shown example, the ring coil 124 is located outside of the volume coil 122, but it is appreciated that the ring coil 124 could have a smaller diameter than the volume coil 122 and therefore be located inside of same.

For the sake of clarity, the end rings 126 and the ring coil 124 may be radially aligned with each other so that angular measurements may correspond with the other. For example, 0 degrees (deg.) on the opposed rings 126 may correspond with each other and with a 0 deg. on the ring coil 124.

However, in yet other embodiments, the end rings 126 and/or the ring coil 124 may be rotated axially relative to each other.

Similarly to the end rings 126, the ring coil 124 may include N' (where N' is an integer greater than 2) ports (p) such as port-n. For example, if N'=4, then the ring coil 124 may include four ports such as port-1, port-2, port-3, and port-4 (generally port-x). For the sake of clarity, it will be assumed that N'=N. However, in yet other embodiments it is envisioned that N' may differ from N. Referring back to the ports and in the case the number of ports N' is 4, each of the ports (port-x) may be radially spaced about 90° apart from an adjacent port-x and may be coupled to a corresponding capacitor 132 of the ring coil 124. The ports (port-x) may be identified by angular location along the opposed ring 126 relative to the radial axis (Ax) of the ring coil 124. Thus, port-1 through port-4 may be referred to as 0°, 90°, 180°, and 270° ports (p'), respectively. For example, if the ring coil 124 includes 4 ports, then these ports may be spatially 90°-azimuthally apart from each other and may be denoted as ports 0° p', 90° p', 180° p', and 270° p' ports. A ring coil 124 which includes four ports may be referred to as a four-port ring coil 124. If N'=2, then the two ports are located 90° spatially apart.

Each of the ports (port-x) may be coupled to an RF controller 142 by corresponding signal leads (SL). Accordingly, the signal leads (SL) may provide a drive signal to a corresponding port (port-x) (e.g., to drive the ring coil 124) for magnetic resonance excitation and may subsequently obtain/receive a resonance signal (e.g., the ARF signal received by the ring coil 124) and provide this signal to the RF controller 142 for further processing such as for reconstruction, etc. It is to be appreciated that suitable T/R switching RF electronics and RF receive signal low-noise pre-amplification may be utilized as is known to one of ordinary skill in the art.

Referring to FIGS. 1 and 2, by placing the ring coil 124 about the center of the volume coil 122, the ring coil 124 may be structured to include a resonant mode with a sinusoidal current distribution along the ring coil 124 structure (e.g., at the mid-plane). Accordingly, when driven in accordance with embodiments of the present system, the ring coil 124 may generate a $B_1$ field (e.g., $B_{1RC}$) which may act as a secondary $B_1$ field in combination with a primary $B_1$ field generated by the volume coil 122 ($B_{1VC}$). Thus, $B_1 = B_{1VC} + B_{1RC}$. It is appreciated that this combination of fields is in a vector sense. Accordingly, these two $B_1$ fields, which exhibit different spatial variation properties, (e.g., $B_{1VC} + B_{1RC}$ may be added or subtracted from each other to enhance RF shimming (e.g., $B_1^+$ shimming) during operation. The secondary $B_1$ field (e.g., $B_{1RC}$) may be orientated substantially in plane with the mid-plane of the volume coil 122 and may be transverse to the main magnetic field $B_0$. Thus, the secondary $B_1$ field may be orientated to travel in direction which is substantially parallel to the mid-plane of the volume coil 122 and transverse to the main magnetic field $B_0$. This will be explained in further detail below with respect to FIGS. 8A through 8C below.

The shield 138 may be placed outside of, and surrounding, the volume and ring coils 122 and 124, respectively. The shield 138 may include any suitable RF shield and may have any suitable shape, such as a cylindrical shape, and may be formed from any suitable material, such as thin copper or an or equivalent type of shielding material or materials compatible with MRI uses. For example, in accordance with some embodiments, the shield 138 may be formed from a conductive mesh, such as a copper mesh, non-magnetic stainless steel mesh, segmented copper in a printed circuit board type construction, or the like. The shield 138 may be grounded, if desired. In accordance with embodiments of the present system, the shield 138 may fit uniformly around the volume and/or ring coils 122 and 124, respectively. The main purpose of the RF shield is to mitigate radiation losses of the volume and ring coils (122 and 124, respectively) and to isolate these coils from the external components of the bore, such as gradient coils and the like.

With regard to tuning of the volume coil 122 and the ring coil 124, in accordance with embodiments of the present system, the volume coil 122 may be tuned to a uniform $B_1^+$ mode at a desired MRI resonant frequency (e.g., the Larmor frequency such as 298 MHz in the case of proton MRI at 7T). This resonant frequency may correspond with a resonant frequency of one or more nuclear species such as $^1H$, $^{13}C$, $^{31}P$, $^{23}Na$, $^{19}F$, or other desired nuclear species. As discussed above, the tuning of the ring coil 124 and/or the volume coil 122 may be performed using reactance elements, such as the capacitors 134, 128, respectively. Accordingly, the capacitors 134 of the ring coil 124 have a selected capacitance which may tune the ring coil 124 to a resonance frequency which may be substantially the same as a resonant frequency (e.g., 298 MHz in the present example corresponding to a resonant frequency of $^1H$ in the present embodiments) of the volume coil 122. Further, at the tuned resonance frequency, the ring coil 124 may include a sinusoidal current mode/distribution along the ring structure. As the ring coil 124 is situated at the mid-plane of the volume coil 122 (e.g., equidistant from the end rings 126), the ring coil 124 may have a negligible effect on the resonance of the volume coil 122, and vice versa. Thus, the two coils (e.g., the volume coil 122 and the ring coil 124) may be driven independently of each other with at least two independent transmit/receive (T/R) RF channels as may be discussed with respect to FIGS. 6 and 7 below. $B_1^+$ shimming may be achieved, if desired, by varying, for example, amplitude and/or phase of each T/R RF channel being used.

The volume coil 122, the ring coil 124, and/or the shield 138 and may be coupled to each other using any suitable coupler, such as a ring coupler which may be formed from a dielectric material such as plastic or the like and may support the volume coil 122 and/or the ring coil 124, and/or the shield 138 in a fixed position relative to each other. For example, in accordance with some embodiments, the volume coil 122 and/or the ring coil 124 may be printed using a conductive material such as copper upon the ring coupler. Thus, the ring coupler may act as a substrate upon which the volume coil 122 and/or the ring coil 124 may be deposited. The ring coupler may mechanically couple the volume coil 122 and the ring coil 124. However, in accordance with embodiments of the present system, the ring coupler should not enable significant RF coupling between the volume coil 122 and the ring coil 124 or between the volume coil 122, the ring coil 124, and RF shield. However, it will be also appreciated that in accordance with yet other embodiments, the ring coupler may mechanically couple and provide for RF coupling between, for example, one or both of the coils (e.g., the volume coil 122 and/or the ring coil 124) and the RF shield, to further manipulate B1 field spatial properties, as may be desired.

A rear perspective view of the volume type RF coil portion 221 may be similar to the front perspective side view of the RF coil portion 221 and is not shown for the sake of clarity.

Figure 3:
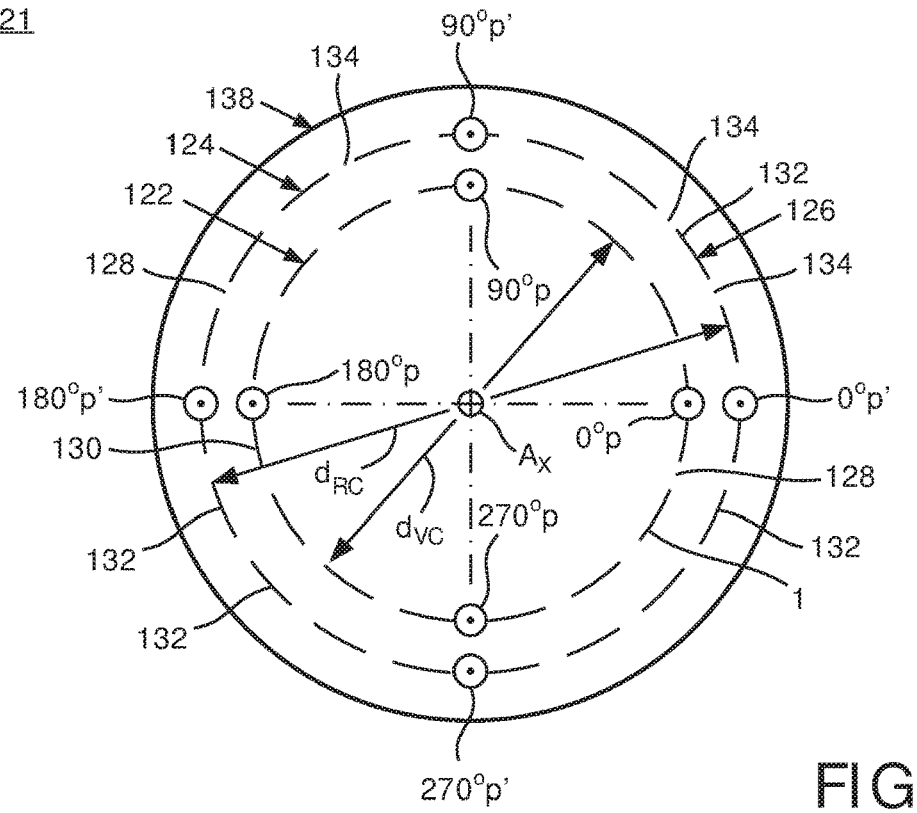
FIG. 3 shows a top view of the RF coil portion of FIG. 2 in accordance with embodiments of the present system.

FIG. 3 shows a top view of the RF coil portion 221 of FIG. 2 in accordance with embodiments of the present system.

The shield 138 may have a circular or substantially circular shape and may encircle the volume coil 122 and the ring coil 124 (e.g. a top ring coil is shown). The capacitors 128 are illustrated as gaps between conductive segments 130 of one of the end rings 126. Similarly, the capacitors 134 are illustrated as gaps between conductive segments 132 of the ring coil 124. Further, the ports (port-1 through port-4) are illustrated by circles ("O"'s with dots within them) for the sake of clarity and labeled by their position (e.g., 0°, 90°, 180°, and 270°). Thus, the ports of the corresponding end ring 126 are illustrated as 0° p, 90° p, 180° p, and 270° p and the ports of the ring coil 124 are illustrated as 0° p', 90° p', 180° p', and 270° p'. The ring coupler is not shown for the sake of clarity. Although the volume coil 122 and/or the ring coil 124 may be generally circular, in yet other embodiments, it is envisioned that the volume coil 122 and/or the ring coil 124 may have an ellipsoid shape or the like.

Figure 4:
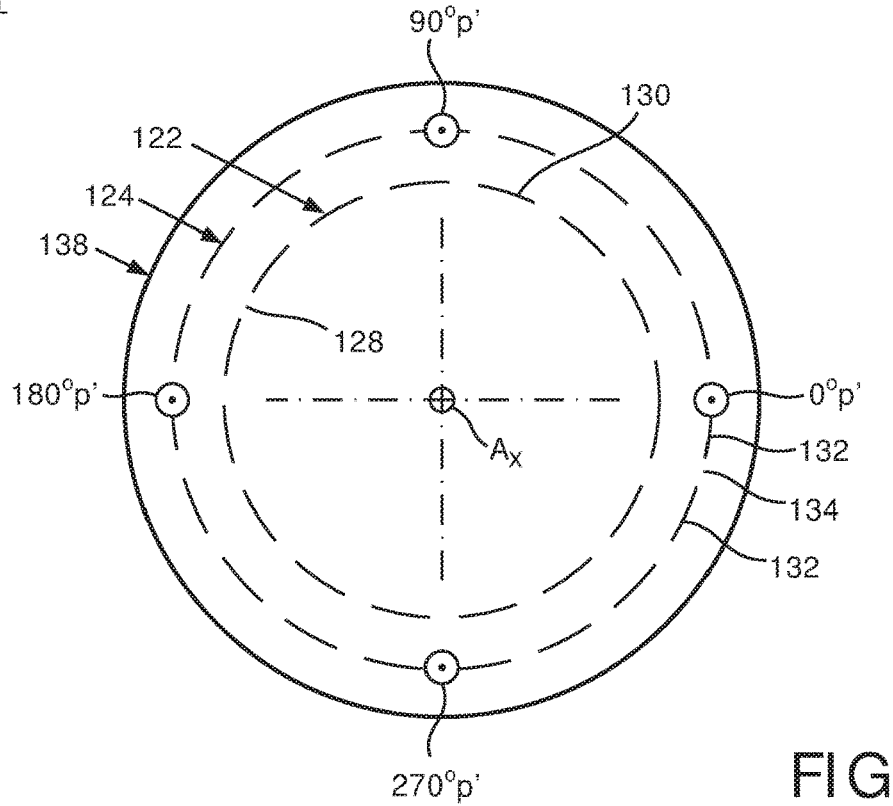
FIG. 4 shows a bottom view of the RF coil portion of FIG. 2 in accordance with embodiments of the present system.

FIG. 4 shows a bottom view of the RF coil portion 221 of FIG. 2 in accordance with embodiments of the present system. FIG. 4 is similar to FIG. 3 however, comparing FIGS. 3 and 4 it is seen that only one of the end rings 126 includes ports, either the top or the bottom end ring 126. Assuming that the end ring 126 shown in FIG. 3 may be referred to as a top or a first end ring, the end ring shown in FIG. 4 may be referred to as a bottom or a second end ring. In other embodiments of the present system, it is envisioned that four ports (e.g., 0° p, 90° p, 180° p, and 270° p) may be distributed at both the top and bottom end rings of the volume coil 122. It is also envisioned that in yet other embodiments of the present system, four ports (0° p, 90° p, 180° p, and 270° p) for volume coil 122 may be distributed in the four spacers 136 (e.g., in rungs of the volume coil 122) which are spatially 90°-azimuthally apart from each other. In other embodiments, it is envisioned that rather than using four ports, the volume coil 122 and the ring coil 124, may include only two ports (0° p, 90° p) and (0° p', 90° p'). However, in the case in which only two ports are provided, it will be appreciated that the 0° p ((0° p') and 90° p (90° p') port may be spatially 90°-azimuthal apart from each other.

Figure 5:
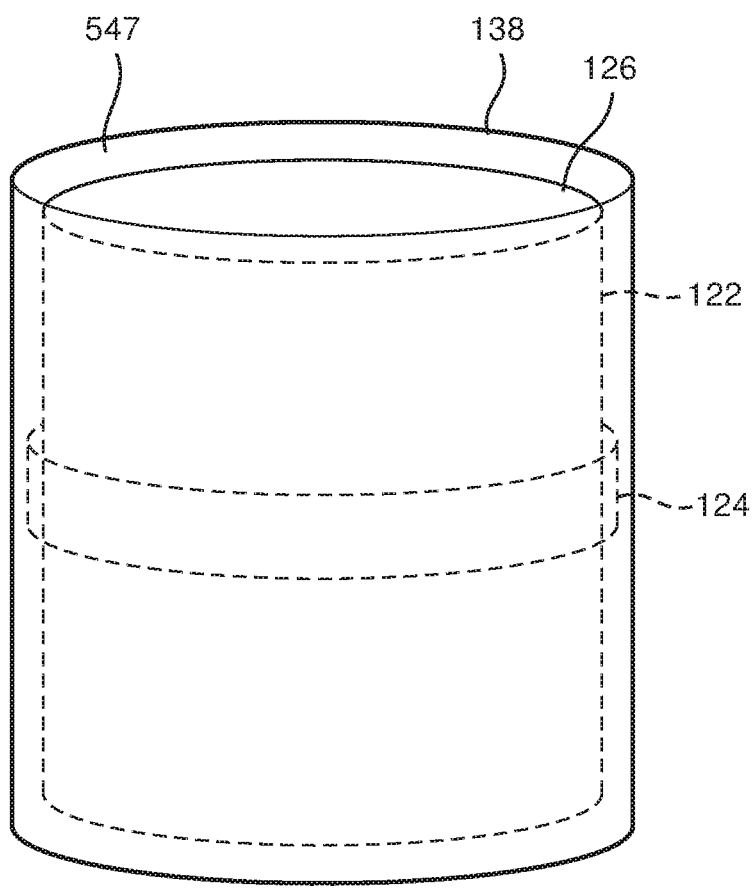
FIG. 5 shows a front perspective side view of the RF coil portion in accordance with embodiments of the present system.

FIG. 5 shows a front perspective side view of the RF coil portion 221 in accordance with embodiments of the present system. The shield 138 may form a cylinder having a cavity 547 in which the volume coil 122 and the ring coil 124 may be located. A rear perspective side view may be similar to the front perspective side view of the RF coil portion 221 and is not shown for the sake of clarity.

Figure 6:
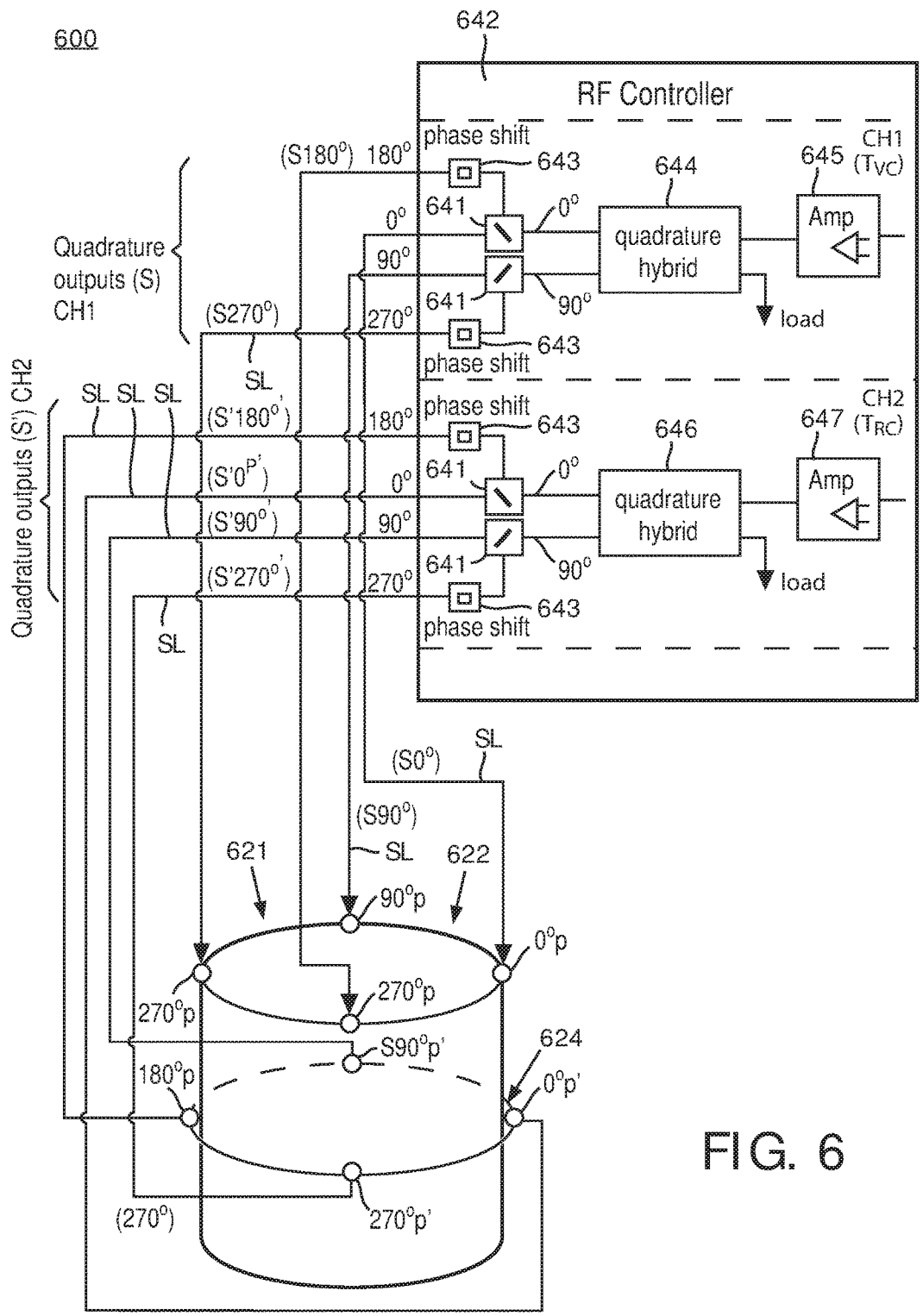
FIG. 6 shows a schematic diagram of an RF controller for driving an RF coil portion using two independent transmit/receive (T/R) RF channels, a T/R RF channel with one amplifier for a volume coil, and another independent T/R channel with an amplifier for a ring coil, respectively, in accordance with embodiments of the present system.

FIG. 6 shows a schematic diagram of an RF controller 642 for driving an RF coil portion 621 using two independent transmit/receive (T/R) RF channels, one T/R RF channel with an amplifier 645 for a volume coil 622, and another independent T/R channel with an amplifier 647 for a ring coil 624, respectively, in accordance with embodiments of the present system. The RF controller 642 may be similar to the RF controller 142 of FIG. 1 and may include two independent T/R RF channels (e.g., first and second T/R RF channels) which may generate corresponding signals to drive (e.g., excite) an RF coil portion 621 which may be similar to the RF coil portion 121, 221. During operation, the RF controller 642 may generate and/or otherwise receive a transmit-to-volume coil (TVC) signal and a transmit-to-ring coil (TRC) signal. For the sake of clarity, the RF switching from a transmit mode to a receive mode, with associated T/R switches and pre-amplifiers, is not illustrated as this is well-known by those of ordinary skill in the art. The TVC signal may be based upon an RF timing sequence for the volume coil 622 and the TRC signal may be based upon an RF timing sequence for the ring coil 624 and may be independent of the TVC signal. That is, the TVC and TRC signals are independently generated where their amplitudes and phases may be varied to provide proper/improved $B_1^+$ shimming effects.

With respect to the first T/R RF channel (CH1) (e.g., a volume coil transmit channel), signals in this channel may be based upon the TVC signal and may be formed as follows. The TVC signal may be input into a first amplifier 645 which may amplify this signal a desired amount and thereafter transmit the amplified TVC signal to a first quadrature hybrid portion 644. The first quadrature hybrid portion 644 may then split the amplified TVC signal into corresponding 0 degree (S0°) and 90 degree phase-shifted (S90°) signals. Then, these signals (e.g., the S0° and S90°) may each be split (e.g., by corresponding RF power splitters 641) with a portion output by the RF controller 642 to drive the volume coil 622 and another portion input into corresponding phase shifters 643 which phase shift these signals (e.g., by 180°) and thereafter output the phase-shifted signals (e.g., S180° and S270°) to drive the volume coil 622. Accordingly, the input TVC signal may be amplified, and split into four equal (amplitude) signals with progressive phase shifts (e.g., 0°, 90°, 180°, and 270°) which may be fed to corresponding ports (e.g., 0° p, 90° p, 180° p, and 270° p, respectively) of the volume coil 622 to drive the volume coil 622.

With respect to the second T/R RF channel (CH2) (e.g., a ring coil transmit channel), signals in this channel may be based upon the TRC signal and may be formed as follows. The TRC signal may be input into a second amplifier 647 which may amplify this signal a desired amount and thereafter transmit the amplified TRC signal to a second quadrature hybrid portion 646. The second quadrature hybrid portion 646 may then split the amplified TRC signal into corresponding 0 degree (S'0°) and 90 degree phase-shifted (S'90°) signals. Then, these signals (e.g., S0° and S90°) may each be split (e.g., by corresponding RF power splitters 641) with a portion output by the RF controller 642 to drive the ring coil 624 and another portion input into corresponding phase shifters 643 which phase shift these signals (e.g., by 180°) and thereafter output the phase-shifted signals (e.g., S'180° and S'270°) to drive the ring coil 624. Accordingly, the input TRC signal may be amplified, and split into four equal (amplitude) signals with progressive phase shifts (e.g., 0°, 90°, 180°, and 270°) which may be fed to corresponding ports (e.g., 0° p', 90° p', 180° p', and 270° p', respectively) of the ring coil 624 to drive the ring coil 624.

Figure 7:
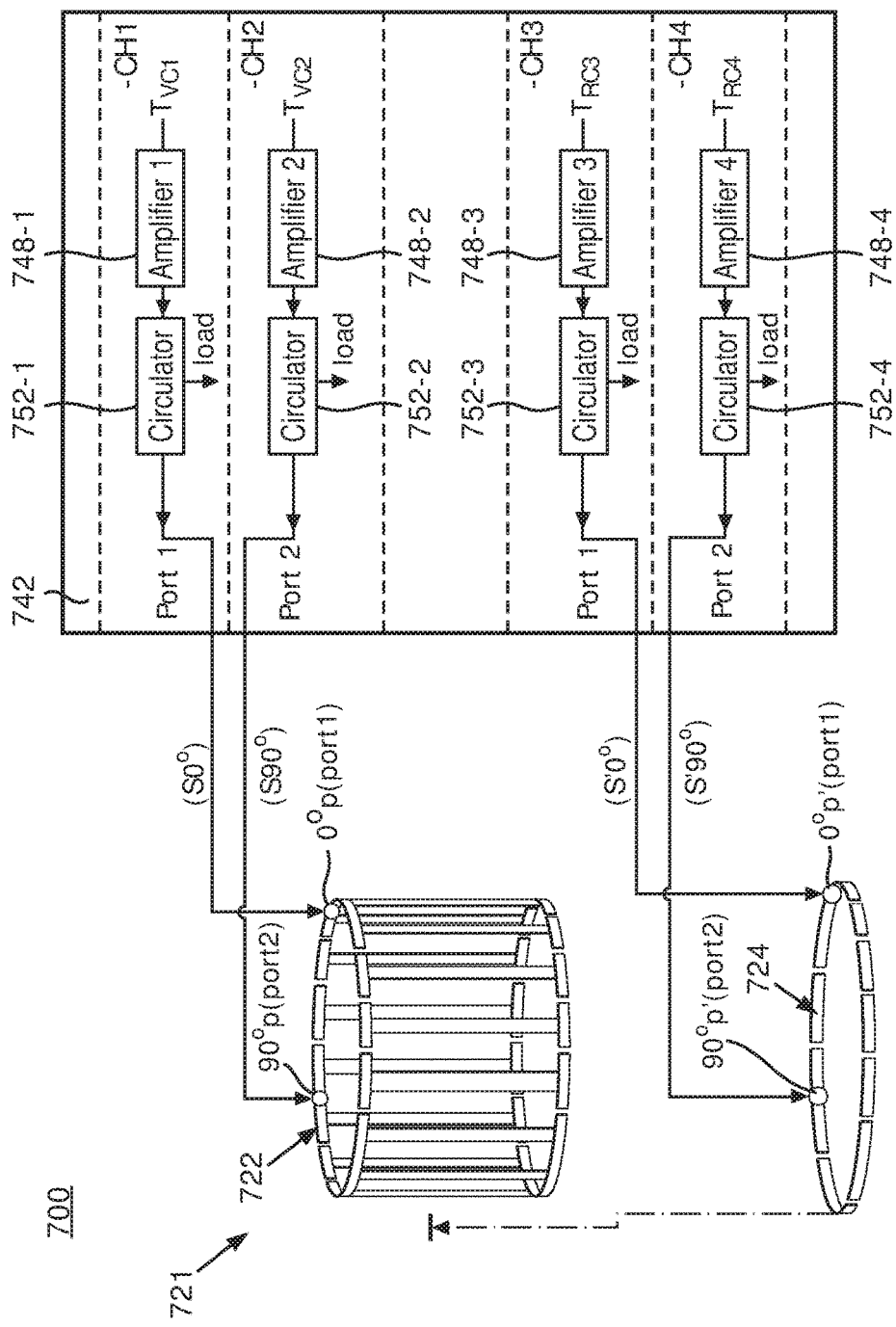
FIG. 7 shows a partially exploded schematic diagram of an RF controller for driving a two-port-type RF coil portion in accordance with embodiments of the present system.

FIG. 7 shows a partially exploded schematic diagram of an RF controller 742 for driving a two-port-type RF coil portion 721 in accordance with embodiments of the present system. The RF coil portion 721 may include a volume coil 722 having first and second ports (0° p and 90° p, respectively) and a ring coil 724 having first and second ports (0° p' and 90° p', respectively). The RF controller 742 may include four independent T/R RF channels (CH1 through CH4), with two channels (e.g., CH1 and CH2) driving the volume coil 722 and two channels (e.g., CH3 and CH4) driving the ring coil 724. Each of these four channels (e.g., CH1 through CH4) may have one amplifier (e.g., 748-1 through 748-4, respectively).

The RF controller 742 may be similar to the RF controller 142 of FIG. 1 and the RF controller 642 of FIG. 6. However, RF isolators/circulators 752-1 through 752-4 (generally 752-x) may be included in each transmit path to route reflected power to a resistive dump load and thereby away from corresponding RF amplifiers 748-x. These circulators 752-x may replace the combination of quadrature hybrid circuits 644, 646 and phase shifters 643 and loads shown in FIG. 6. The amplitude and phase of four amplifiers (748-1 and 748-2) and (748-3 and 748-4) (generally 748-*x*) may be changed independently for $B_1^+$ shimming effect.

During operation, the RF controller 742 may generate and/or otherwise receive first and second TVC signals (TVC1 and TVC2, respectively, for CH1 and CH2, respectively) and first and second TRC signals (TRC1 and TRC2, respectively, for CH3 and CH4, respectively).

The RF controller 742 may generate and/or receive the two TVC signals and two TRC signals independently.

With respect to the first T/R RF channel (CH1), an output signal in this channel may be based upon the first of TVC signals TVC1 and may be formed as follows. The TVC1 signal may be input into the first amplifier 748-1 which may amplify this signal a desired amount and add a desired phase shift to the signal thereafter transmit the amplified TVC1 signal to a circulator 752-1 which may route the signal to a corresponding port (e.g., 0° p) of the volume coil 722 to drive the volume coil 722. Similarly, with respect to the second T/R RF channel (CH2), the second of TVC signals TVC2 signal may be input into the second amplifier 748-2 which may amplify this signal a desired amount and add another desired phase shift to the signal thereafter transmit the amplified TVC2 signal to a circulator 752-2 which may route the signal to a corresponding port (e.g., 90° p) of the volume coil 722 to drive the volume coil 722.

With respect to the third T/R RF channel (CH3), an output signal in this channel may be based upon the first of TRC signals TRC1 and may be formed as follows. The TRC1 signal may be input into the third amplifier 748-3 which may amplify this signal a desired amount and add a desired phase shift to the signal thereafter transmit the amplified TRC1 signal to a circulator 752-3 which may route the signal to a corresponding port (e.g., 0° p') of the ring coil 724 to drive the ring coil 724. Similarly, the TRC2 signal may be input into the fourth amplifier 748-4 which may amplify this signal a desired amount and add another desired phase shift to the signal thereafter transmit the amplified TRC2 signal to a circulator 752-4 which may route the signal to a corresponding port (e.g., 90° p') of the ring coil 724 to drive the ring coil 724.

During operation, the first circulator 752-1 may route an amplified and phase shifted signal to excite the volume coil 722 at a sinusoidal (sin) mode while the second circulator 752-2 may route an amplified and another phase shifted signal to excite the volume coil 722 at a cosinusoidal (cos) mode. With reference to ports 1 and 2 of the volume coil 722, these ports may be situated spatially 90°-azimuthally apart from each other. Similarly, the third circulator 752-3 may route an amplified and phase shifted signal to excite the ring coil 724 at a sinusoidal mode while the forth circulator 752-4 may route an amplified and phase shifted signal to excite the ring coil 724 at a cosinusoidal mode. With reference to ports 1 and 2 of the ring coil 724, these ports may be situated spatially 90°-azimuthally apart from each other. The four amplified signals and their phase shifts may be independent and generally different from each other and may be controlled by the RF controller 742.

Figure 8:
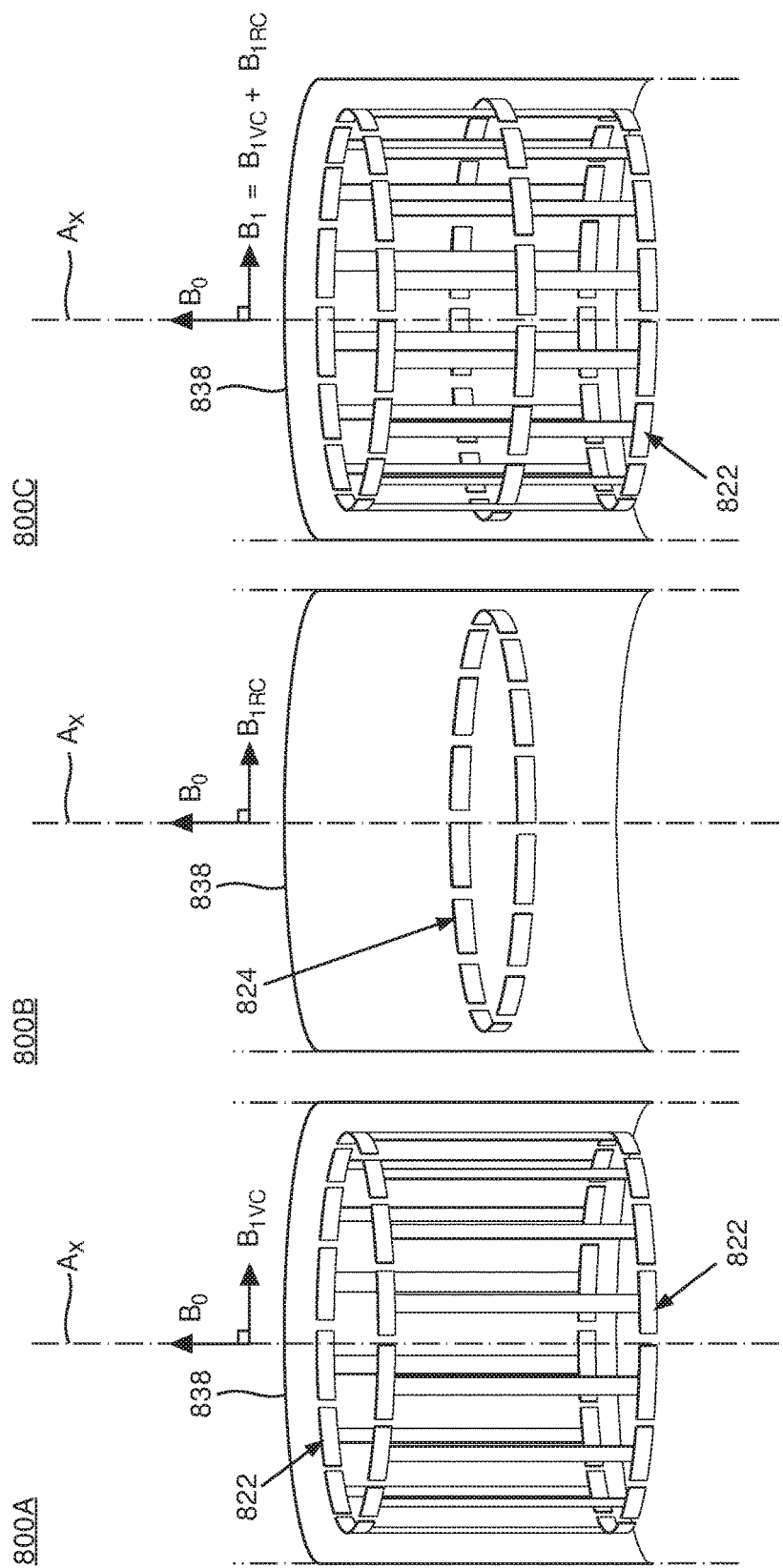
FIG. 8A shows a shielded volume coil operating in sinusoidal (sin) and cosinusoidal (cos) current distribution modes in accordance with embodiments of the present system.
FIG. 8B shows a shielded ring coil operating in sin and cos current distribution modes in accordance with embodiments of the present system.
FIG. 8C shows a shielded volume and ring coil combination operating in sin and cos current distribution modes in accordance with embodiments of the present system.

Current distribution for an RF portion operating in accordance with embodiments of the present system will now be explained with reference to FIGS. 8A through 8C, where: FIG. 8A shows a current distribution mode for a shielded volume coil 800A operating in accordance with embodiments of the present system; FIG. 8B shows a current distribution for a shielded ring coil 800B operating in accordance with embodiments of the present system; and FIG. 8C shows a current distribution for a shielded volume and ring coil combination 800C operating in accordance with embodiments of the present system. In FIGS. 8A through 8C, a shield 838 forms a substantially cylindrical shape but is partially cutaway to better illustrate volume and/or ring coils 822 and 824, respectively, contained within.

Referring to FIG. 8A, the volume coil 822 may be excited in two resonant modes: a sinusoidal current distribution mode and a cosinusoidal current distribution mode. The volume coil's 822 generated $B_1$-field ($B_{1VC}$) may be orthogonal to a main magnet $B_0$-field ($B_0$) which, for the sake of clarity, is assumed to be parallel to an axis (Ax) of the volume coil 822. The volume coil 822 may be excited by quadrature signals such as those generated by an RF controller (e.g., controller 642 shown in FIG. 6) or by two independent channels (e.g., CH1 and CH2 of controller 742 shown in FIG. 7).

More particularly, the volume coil's 822 generated $B_1$-field ($B_{1VC}$) may include a sinusoidal component ($B_{1VCSINE}$) corresponding to the sinusoidal current distribution mode and a cosinusoidal component ($B_{1VCCOSINE}$) corresponding to the cosinusoidal current distribution mode each of which propagate radially relative to the axis (Ax) of the volume coil 822 and thus, radially and orthogonally from the main magnet $B_0$-field ($B_0$). As used herein, $B_{1VC}$ may be the combination of $B_{1VCSINE}$ and $B_{1VCCOSINE}$. Current distribution modes are discussed in further detail within U.S. Pat. Nos. 8,089,281 and 8,421,462, to Zhai et al., the contents of which are incorporated herein by reference in their entirety.

Referring to FIG. 8B, the ring coil 824 may be excited in two resonant modes: a sinusoidal current distribution mode and a cosinusoidal current distribution mode. The ring coil's 824 generated $B_1$-field ($B_{1RC}$) may be orthogonal to the main magnet $B_0$-field ($B_0$) and may be generated when the ring coil 824 is excited. The ring coil 824 may be excited by quadrature signals such as those generated by an RF controller (e.g., controller 642 shown in FIG. 6) or by two independent channels (e.g., CH3 and CH4 of controller 742 shown in FIG. 7).

More particularly, the ring coil's 824 generated $B_1$-field ($B_{1RC}$) may include a sinusoidal component ($B_{1RCSINE}$) corresponding to the sinusoidal current distribution mode and a cosinusoidal component ($B_{1RCCOSINE}$) corresponding to the cosinusoidal current distribution mode each of which propagate radially relative to the axis (Ax) of the volume coil 822 and thus, radially and orthogonally from the main magnet $B_0$-field ($B_0$). As used herein, $B_{1RC}$ may be the combination of $B_{1RCSINE}$ and $B_{1RCCOSINE}$.

Referring to FIG. 8C, an RF coil portion 821 may include the volume coil 822 and the ring coil 824, and may output a corresponding $B_1$-field which is perpendicular to the main magnet $B_0$-field. The $B_1$-field may equal to the total of $B_1$-fields generated by the volume coil 822 and the ring coil 824, respectively. In other words, $B_1=B_{1VC}+B_{1RC}$. Further, by exciting the volume coil 822 and the ring coil 824 independently of each other, their respectively output fields $B_{1VC}$ and $B_{1RC}$ may be controlled independently of each other. For example, by independently varying the amplitude and/or phase of the signals respectively exciting the volume coil 822 and the ring coil 824 relative to each other (e.g., by varying amplitude and/or phase of quadrature outputs of a first channel relative to quadrature outputs of a second channel), the $B_1$-field from volume coil 822 (e.g., $B_{1VC}$) and the $B_1$-field from the ring coil 824 (e.g., $B_{1RC}$) may be controlled to such that the combination of RF fields enhances $B_1$-field uniformity (e.g. within a patient being scanned). This may have a resulting effect of improving MRI image quality. To manipulate the RF fields in this manner it may be appreciated that this is accomplished by manipulation of the input signals (e.g., the Tvc and/or the Trc signals or the like) to the amplifiers and that such manipulation may account for amplifier gain and phase effects including, for example, amplifier non-linear gain effects.

Figure 9:
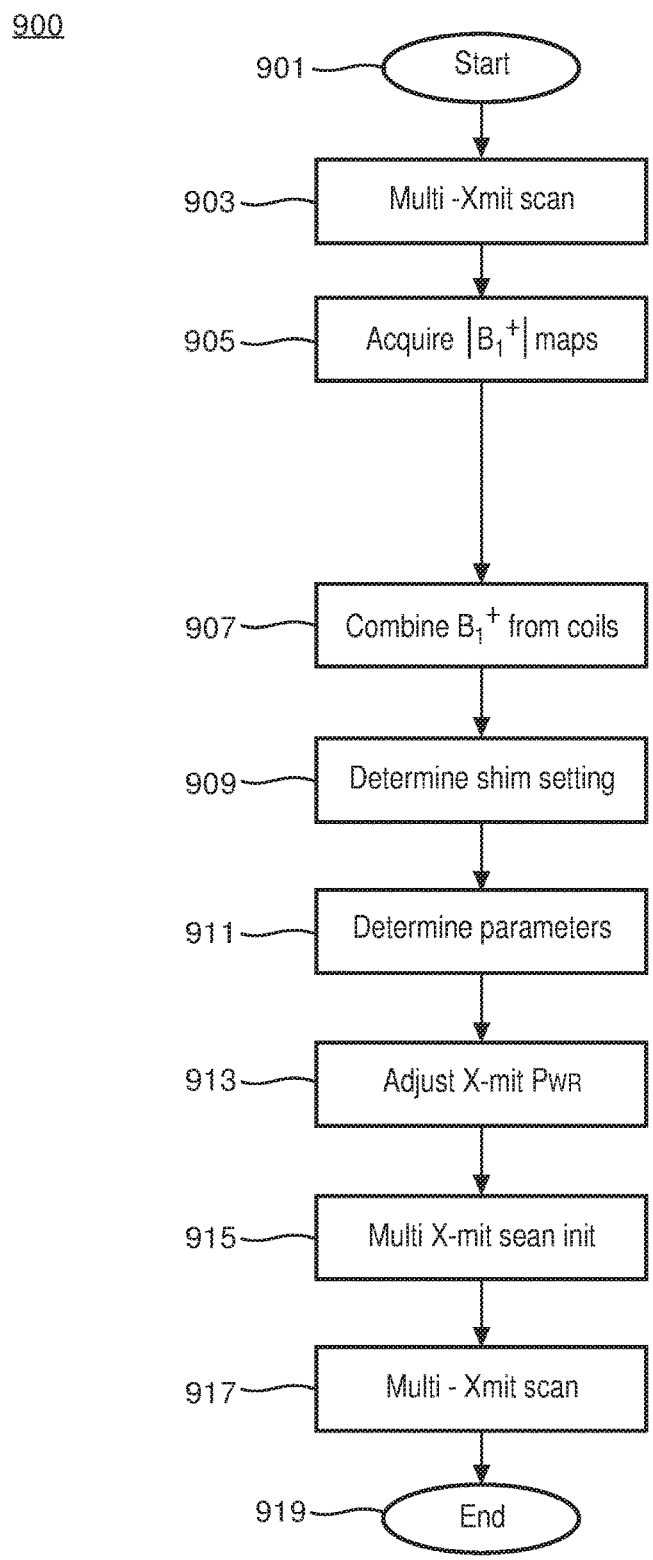
FIG. 9 shows a functional flow diagram that illustrates a process performed in accordance with embodiments of the present system.

FIG. 9 shows a functional flow diagram that illustrates a process 900 performed in accordance with embodiments of the present system. The process 900 may be performed using one or more computers communicating over a network and may obtain information from, and/or store information to one or more memories which may be local and/or remote from each other. The process 900 can include one of more of the following acts. In some embodiments, the acts of process 900 may be performed using a MR system such as an MRI or MRS system including an RF portion operating in accordance with embodiments of the present system. However, for the sake of clarity, acts of the process 900 may be described with relation to an MRI system rather than an MRS system. Further, one or more of these acts may be combined and/or separated into sub-acts, if desired. Further, one or more of these acts may be skipped and/or the order changed, depending upon settings. Further, during the acts of process 900, the process may store information obtained, determined, calculated, set, and/or otherwise generated by the process in a memory of the system for later use in raw and/or processed forms. In operation, the process may start during act 901 and then proceed to act 903.

During act 903, the process may start a multi-transmit pre-scan operation. Accordingly, the process may obtain setting information which may include, for example, a pre-scan sequence and perform an initialization routine to initialize an MRI to perform a multi-scan transmit pre-scan sequence in accordance with embodiments of the present system. After completing act 903, the process may continue to act 905.

During act 905, the process may perform a sufficient number of separate scans to acquire $B_1^+$ maps for each transmit coil/channel to be used for RF shimming, respectively, of a target slice ($S_{target}$). The target slice may be the target imaging slice of a scan object (patient) and could be any slice or multiple slices within the scan object (e.g., an OOI such as a patient, hereinafter scan object). Commonly known MR techniques for acquiring $B_1^+$ maps may apply. The first scan may be performed to acquire the first $B_1^+$ map which may include $B_1^+$ information (generally $B_1^+$ for the sake of clarity) acquired over the target slice or slices using (e.g., by driving) a volume coil operated independently of a ring coil (e.g., the volume coil only). The second scan may be performed to acquire a second $B_1^+$ map which may include $|B_1^+|$ acquired using the ring coil independently of the volume coil (e.g., the ring coil only) and over the same target slice or slices of interest. Accordingly, during acquisition of these $B_1^+$ maps, only one of the volume or ring coils will be driven at a time and corresponding information (e.g., $|B_1^+|$) acquired. Thus, to acquire the first $B_1^+$ map, the process may control a signal input into a first amplifier (e.g., TVC, where the voltage may be denoted as $V_1$ and the phase ($\varphi_1$) which drives circuitry to generate quadrature signals (e.g., see, S0°, S90°, S180°, and S270°, as shown in FIG. 6) to be input into corresponding ports (e.g., see, 0° p, 90° p, 180° p, and 270° p, as shown in FIG. 6) of the volume coil (e.g., see, 622) so as to drive the volume coil in accordance with embodiments of the present system. The volume coil may also be used as a receive coil to receive MRI signals through the same ports (e.g., see, 0° p, 90° p, 180° p, and 270° p, as shown in FIG. 6). Then, the corresponding $B_1^+$ may be obtained by reading acquired magnetic resonance information obtained from the volume coil to form the first $B_1^+$ map. Similarly, to acquire the second $B_1^+$ map, the process may control a signal input into a second amplifier (e.g., TRC where the voltage may be denoted as $V_2$ and the phase $\varphi_2$) which drives circuitry generate quadrature signals (e.g., see, S'0°', S'90°', S'180°', and S'270°', as shown in FIG. 6) to be input into corresponding ports (e.g., see, 0° p', 90° p', 180° p', and 270° p', as shown in FIG. 6) of the ring coil (e.g., 624) so as to drive the ring coil as may be desired. The ring coil may also be used as a receive coil to receive MRI signals through the same ports (e.g., see, 0° p', 90° p', 180° p' and 270° p', as shown in FIG. 6). Then, the corresponding $|B_1^+|$ may be obtained by reading acquired magnetic resonance information obtained from the ring coil to form the second $B_1^+$ map. Each of the first and second acquisitions may be performed using a known fixed amplitude and a known fixed phase. Thus, an amplitude ratio (AR) of first and second amplifiers' amplitudes (AR=$V_1/V_2$) and the phase difference of TVC and TRC ($\Delta\varphi=\varphi_1-\varphi_2$) during the first and second acquisitions are known. After completing act 905, the process may continue to act 907.

During act 907, the process may be operative to numerically combine the $|B_1^+|$ fields obtained from the volume and ring coils during act 905 to form combined $B_1^+$ maps over the target slice or slices, for different simulated relative amplitudes and relative phase shifts that may vary from the acquired data conditions. By varying the values of AR (for example, from 0 to 100, or $V_2$=0) and $\Delta\varphi$ (for example from 0° to 360°), the combined $B_1^+$ maps from volume coil and ring coil is calculable. For example, the combined complex $B_1^+$ may be calculated based on the complex $B_1^+$ maps from volume coil and ring coil as AR×$e^{i\Delta\varphi}$×$B_1^+$(volume coil)+$B_1^+$(ring coil). The absolute combined $B_1^+$ ($|B_1^+|$) distribution information over the target slice $S_{target}$, or slices may be used to calculate criteria parameters such as standard deviation, ratio of spatially maximum $|B_1^+|$ to spatially minimum $|B_1^+|$, and specific energy absorption rate (SAR) levels, etc., as a function of various AR and $\Delta\varphi$.

During act 909, the process may determine a shim setting (e.g., an RF shim setting) which may include corresponding values of AR and $\Delta\varphi$ for the shim setting. To determine values of AR and $\Delta\varphi$ for the shim setting, the process may analyze the statistical and other information from step 907 and determine: (1) a minimum $|B_1^+|$ standard deviation on the target slice; and/or (2) a minimum ratio of (maximum $|B_1^+|$) to (minimum $|B_1^+|$) on the target slice, and/or (3) a minimum SAR level condition, or (4) a weighted combination of these aspects, as may be desired and/or set by the system. Then, the process may determine corresponding values of AR and $\Delta\varphi$ for the determined values of the minimum $|B_1^+|$ standard deviation and/or the minimum ratio of (maximum $|B_1^+|$) to (minimum $|B_1^+|$) on the target slice. The shim setting may then be set to these values of AR and $\Delta\varphi$. For example of a shim setting with AR=1 and $\Delta\varphi$=0, the volume coil and ring coil may be excited independently with the same amplitude and relative phase of 0. After completing act 909, the process may continue to act 911.

During act 911, the process may determine one or more of parameters. These parameters may include a combined mean $|B_1^+|$ on the target slice which is the average combined $|B_1^+|$ over the target slice from determined shim setting AR and $\Delta\varphi$ in act 909, a final specific absorption rate (SAR) which may be obtained from a lookup table in system memory corresponding to shim setting AR and Δφ from act 911 (SAR may be pre-calculated for all possible various shim settings and stored in system memory as a lookup table or calculated in a real-time scan corresponding to shim setting from act 909), and a transmit power (amplitude) for $V_1$ and $V_2$, for the shim setting (e.g., AR and Δφ) determined above during act 909. The combined mean $|B_1^+|$, the final SAR estimate, and the transmit power for $V_1$ and $V_2$, may be determined based upon information stored in association with the shim setting (e.g., AR and Δφ) for the target slice or slices. Thus, knowing the shim setting, the process may obtain the associated values of one or more of the combined mean $|B_1^+|$, the final SAR, and/or the transmit power for $V_1$ and $V_2$. After completing act 911, the process may continue to act 913.

During act 913, the process may further adjust the transmit power (e.g., value of $V_1$ and $V_2$) so that one or more of the final SAR, the combined mean $|B_1^+|$, and amplifier transmit power are within corresponding threshold values. Alternately, other scan parameters such as repeat time and number of slices within a given repeat time, may be varied to manipulate the final SAR level if desired. For example, the process may obtain threshold values for a transmit power limit (e.g., $V_{1thresh}$ and $V_{2thresh}$), the SAR threshold ($SAR_{thresh}$), and a combined mean $|B_1^+|$ threshold or target $|B_1^+|$ ($|B_1^+|_{thresh}$), from a memory of the system. Then, the process may then adjust signal parameters, such as the transmit power based upon results of a comparison of the above values with their corresponding threshold values. For example, the process may perform the following comparisons which may be weighed so that certain comparisons may have an increased importance. For example, a comparison that is weighted higher than another comparison (e.g., the another comparison having a lower weighting) may be performed first. Conversely, a comparison that is weighted lower than another comparison may be performed after a comparison has the higher weighting. Comparisons, actions, and/or weights may be set by the user and/or system and stored in a memory of the system for later use. For example, the process may obtain a comparison table such as shown in Table 1 below that is stored in a memory of the system and which may be set and/or reset by the user. The process may then make the determinations listed in the table and, if it is determined that the determination occurs (e.g., a determination is true or when the determination is found to occur), the process may perform the corresponding actions in accordance with the corresponding weight. The higher the weight is then the more important the weight is. Thus, if a first determination has a weight of 4 and the second determination has a weight of 10, the second determination may preempt the first determination.

TABLE 1

(as an example of implementation)

| Comparison (Determination) | Action (s) Action(s) performed if determination is affirmative (e.g., true) | Weight weight | Comments |
|---|---|---|---|
| $V_1 > V1thresh$ | $V_1 = V_1 - \Delta V$<br>$V_2 = V_2 - V_2/V_1 \times \Delta V$ | 10 | Decrease $V_1$ by ΔV, decrease $V_2$ by $V_2/V_1 \times \Delta V$ |
| $V_1 < V1thresh$ | $V_1 = V_1 + \Delta V$<br>$V_2 = V_2 + V_2/V_1 \times \Delta V$ | 10 | Increase $V_1$ by ΔV Increase $V_2$ by $V_2/V_1 \times \Delta V$ |
| $V_1 \approx V1thresh$ | $V_1 = V_1$ | 10 | $V_1$ remains the same/no action (also if substantially equal) |
| $V_2 > V2thresh$ | $V_2 = V_2 - \Delta V$<br>$V_1 = V_1 - V_1/V_2 \times \Delta V$ | 10 | Decrease $V_2$ by ΔV decrease $V_1$ by $V_1/V_2 \times \Delta V$ |
| $V_2 < V2thresh$ | $V_2 = V_2 + \Delta V$<br>$V_1 = V_1 + V_1/V_2 \times \Delta V$ | 10 | Increase $V_2$ by ΔV increase $V_1$ by $V_1/V_2 \times \Delta V$ |
| $V_2 \approx V2thresh$ | $V_2 = V_2$ | 10 | $V_2$ remains the same/no action (also if substantially equal) |
| combined mean $|B_1^+| > |B_1^+|thresh$ | $V_1 = V_1/(|B_1^+|/|B_1^+|thresh)$<br>$V_2 = V_2/(|B_1^+|/|B_1^+|thresh)$ | 10 | Decrease $V_1$ and $V_2$ by a factor of $(|B_1^+|/|B_1^+|thresh)$ |
| combined mean $|B_1^+| < |B_1^+|thresh$ | $V_1 = V_1 \times (|B_1^+|/|B_1^+|thresh)$<br>$V_2 = V_2 \times (|B_1^+|/|B_1^+|thresh)$ | 10 | Increase $V_1$ and $V_2$ by a factor of $(|B_1^+|/|B_1^+|thresh)$ and go back to re-check $V_1$ and $V_2$ if they meet thresh |
| combined mean $|B_1^+| \approx |B_1^+|thresh$ | $V_1 = V_1$ and $V_2 = V_2$ | 10 | No action |
| SAR limit > SARthresh | $V_1 = V_1$ and $V_2 = V_2$ | 10 | Reduce tip angle, or reduce number of slices, or increase scan repeat time |
| SAR limit < SARthresh | $V_1 = V_1$ and $V_2 = V_2$ | 10 | No action |
| SAR limit ≈ SARthresh | $V_1 = V_1$ and $V_2 = V_2$ | 10 | No action |
| . . . | . . . | . . . | . . . |

After completing act 913, the process may continue to act 915.

During act 915, the process may initialize parameters for a multi-transmit scan (e.g., perform a multi-transmit scan initialization). Accordingly, the process may set operating parameters and/or settings for the multi-transmit scan in accordance with settings derived during the multi-transmit pre-scan operation described above, such as the determined shim setting (e.g., AR and Δφ), the determined transmit power (e.g., values of $V_1$ and $V_2$), etc.). After completing act 915, the process may continue to act 917.

During act 917, the process may perform the multi-transmit scan operation using the settings initialization parameters determined during act 915. During this act, the process may excite an RF portion and may acquire magnetic resonance information in accordance with embodiments of the present system. It may be appreciated that the receive coil function may be performed at this stage by a dedicated receive-only coil, such as an array receive-only coil, that is optimized for the target anatomy and application, as is known by those skilled in the art. The acquired magnetic resonance information may then, for example, be processed to reconstruct an image (or images), etc. Thereafter, the reconstructed image (or images) may be rendered using a rendering device such as a display and/or printer, and/or stored in a memory of the system for later use. Further, during the multi-transmit scan operation, the process may further vary (e.g., to tune) the operating parameters and/or settings, if desired. During this act, the process may further update history information with information generated during the current process. This information may then be used to further tune the system, if desired. After completing act 917, the process may continue to act 919, where it ends.

Figure 10:
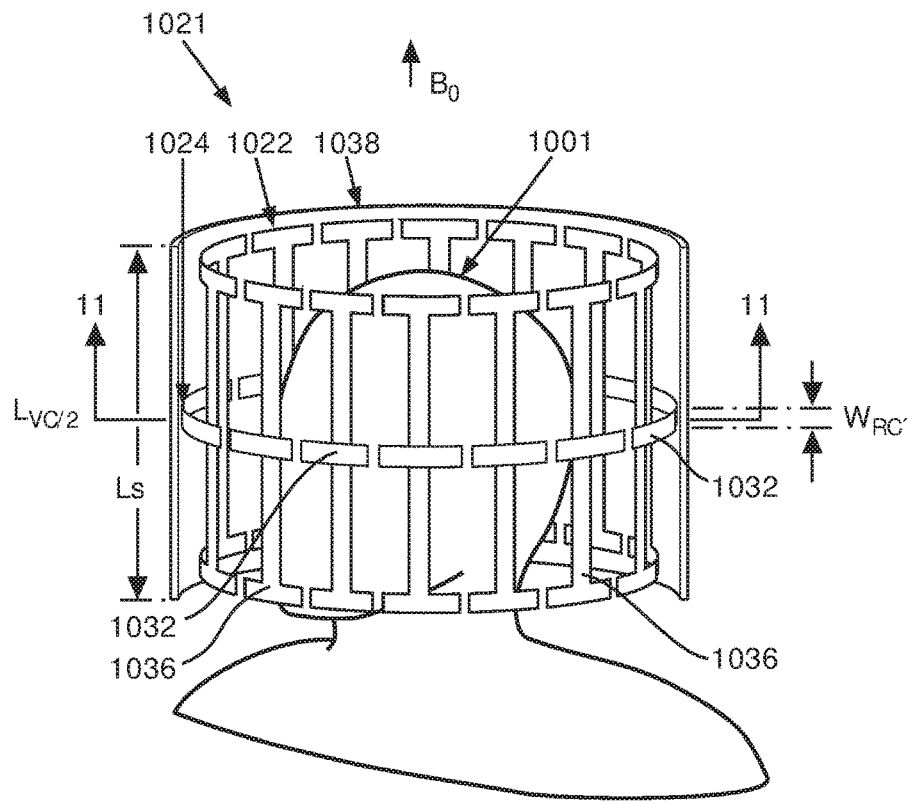
FIG. 10 shows a partially cutaway front perspective view of a finite-difference time-domain (FDTD) numerical model of an RF coil portion with a model head therein in accordance with embodiments of the present system.
Figure 11:
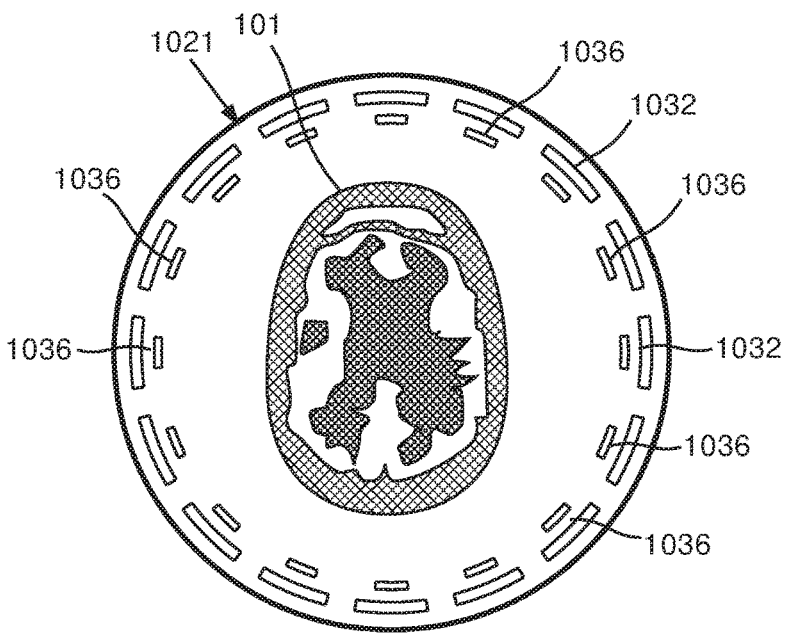
FIG. 11 shows a graph of a center transverse slice (S) of the model head and the RF coil portion taken along lines 11-11 of the model of FIG. 10 in accordance with embodiments of the present system.
Figures 12A, 12B, 12C:
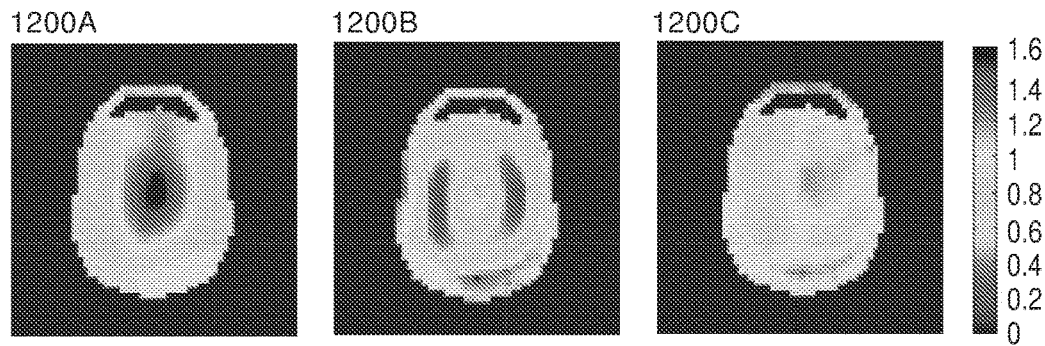
FIG. 12A shows a graph of a normalized $|B_1^+|$-field (i.e., $|B_1^+|/|B_1^+|_{avg}$) for the slice (S), where $|B_1^+|_{avg}$ is the average $|B_1^+|$ over the slice (S), acquired only with volume coil excitation in accordance with embodiments of the present system.
FIG. 12B shows a graph of $|B_1^+|/|B_1^+|_{avg}$ for the slice (S) acquired only with ring coil excitation in accordance with embodiments of the present system.
FIG. 12C shows a graph of $|B_1^+|/|B_1^+|_{avg}$ after $|B_1^+|$ shimming for the slice (S) acquired with volume and ring coil excitation in accordance with embodiments of the present system.

Test (simulation) results will now be described with reference to FIGS. 10 through 12C where: FIG. 10 shows a partially cutaway front perspective view 1000 of a finite-difference time-domain (FDTD) numerical model (hereinafter the model for the sake of clarity) of an RF coil portion 1021 with a model head therein in accordance with embodiments of the present system; FIG. 11 shows a graph 1100 of a center transverse slice (S) of the model head and the RF coil portion 1021 taken along lines 11-11 of the model of FIG. 10 in accordance with embodiments of the present system; FIG. 12A shows a graph 1200A of a normalized $|B_1^+|$-field (i.e., $|B_1^+|/|B_1^+|_{mean}$) for the slice (S), where $|B_1^+|_{mean}$ is the mean $|B_1^+|$ over the slice (S), acquired with only volume coil excitation in accordance with embodiments of the present system; FIG. 12B shows a graph 1200B of $|B_1^+|/|B_1^+|_{mean}$ for the slice (S) acquired with only ring coil excitation in accordance with embodiments of the present system; and FIG. 12C shows a graph 1200C of $|B_1^+|/|B_1^+|_{mean}$ after $|B_1^+|$ shimming for the slice (S) acquired with volume and ring coil excitation in accordance with embodiments of the present system.

Referring to FIG. 10, the RF coil portion 1021 may be similar to the RF coil portion 121 may include a volume coil 1022, a ring coil 1024, and a shield 1038 which may be similar to the volume coil 122, the ring coil 124, and the shield 138, respectively. The RF coil portion 1021 may be loaded by a model head 1001. The volume coil 1022 may have a diameter of about 30 cm, and a length (e.g., $L_{vc}$) of about 20 cm. The shield 1038 may have a diameter of about 35 cm and a length of 25.5 cm. The ring coil 1024 has a diameter of about 32 cm and width ($W_{RC}$) of 1.5 cm.

The coils (e.g., 1024 and 1022) may be tuned to 298 MHz for a 7Tesla (7T) proton MRI. However, other tuning values are also envisioned and may be based upon the main magnetic field value of the MRI system. Two independent transmit channels (e.g., first and second transmit channels CH1 and CH2, respectively) may be controlled to drive the coils (e.g., 1024 and/or 1022) of the RF coil portion 1021 in accordance with embodiments of the present system. For example, the first and second channels may each include one amplifier and a quadrature hybrid circuit to split the RF power equally to four ports of each of the coils (e.g., 1022 and 1024) with progressive phase shifts of 90°, such as described in connection with FIG. 6, for example. Thus, when driven by a corresponding channel (e.g., CH1, CH2), each coil (e.g., 1022 and 1024, respectively) may be driven in quadrature. Alternatively, four independent transmit channels may each include one amplifier and one circulator, such as described in connection with FIG. 7, for example. Further, when the ring coil 1024 is not being driven (e.g., no RF power is being transmitted to the ring coil 1024 via CH2), the volume coil 1022 may function as a conventional birdcage-type coil, and may obtain all the benefits of conventional birdcage-type coils. However, when the ring coil 1024 is being driven (e.g., CH2 is transmitting RF power to drive the ring coil 1024), a $B_1^+$ field generated by the ring coil 1024 may be used to improve overall $B_1^+$ field uniformity within a scanning volume situated within the volume coil 1022 such as within the head of the patient 101. Unlike conventional multiple-channel transmit techniques, the use of circulators may not be necessary when using quadrature hybrid circuits, such as described in connection with FIG. 6, since the quadrature hybrid's fourth port may be used to route reflected power away from RF amplifiers, as is known in the art.

Referring to FIG. 11, the center transverse slice (S) of the model head 1001 is shown relative to the RF coil portion 1021 for reference. Slice (S) may be situated substantially at the mid-plane of the volume coil 1022 (e.g. at $L_{vc}/2$). $|B_1^+|$ shimming for the center transverse slice (S) with the slice position shown in FIG. 11 will now be discussed with reference to FIGS. 12A through 12C. Optimum $|B_1^+|$ shimming may be achieved by minimizing the $|B_1^+|$ field standard deviation in the selected slice (e.g., slice (S) in the current embodiments) by independently varying amplitude and/or phase difference between a volume coil transmit channel (e.g., see CH1, FIG. 6) and a ring coil transmit channel (e.g., see CH2, FIG. 6).

From FDTD numerical calculation with model head, model volume coil and model ring coil, for 1W of total absorbed average power in the model head, $|B_1^+|_{mean}$ at a center slice has been found to be: 0.49 μT for volume coil excitation only (e.g., see, FIG. 12A); 0.13 μT for ring coil excitation only (e.g., see, FIG. 12B); and 0.28 μT for optimum shimming with both volume coil and ring coil excitations (e.g., see, FIG. 12C). In FIG. 12C, for optimum $|B_1^+|$ shimming the amplitude ratio of excited voltage for volume coil to excited voltage for ring coil is ~0.7 with Δφ=160°. With reference to FIG. 12A, from FDTD numerical calculation with model head, model volume coil and model ring coil, when only the volume coil (e.g., 1022) is excited, the $|B_1^+|$-field pattern in the center transverse slice of model head is similar to a conventional birdcage coil at 7T, where $|B_1^+|$ is very non-uniform with higher $|B_1^+|$ 'bright spot' in the center region of the graph 1200.

With reference to FIG. 12B, it is seen that, in the same center transverse slice $|B_1^+|$ generated by the ring coil 1024 has a very different and somewhat complementary pattern compared to that produced by the volume coil 1022, which could be used to advantage for $|B_1^+|$ shimming.

With reference to FIG. 12C, a $|B_1^+|$ pattern is illustrated after optimum $|B_1^+|$ shimming settings are performed to adjust relative amplitude and/or phase of the excited voltage sources for the volume coil and ring coil. For comparison, $|B_1^+|$ standard deviation (normalized) is 0.21 for the volume coil excitation only. By varying the relative amplitude and/or phase of the excited voltage sources for both the volume coil and ring coil, $|B_1^+|$ deviation may be reduced for the volume and the ring coils excitation's simultaneously to about 0.08, which is approximately a 62% reduction from the example using a (quadrature) volume coil excitation only (as shown in FIG. 12A). The $|B_1^+|$ bright spot in the center region of the slice (S) is almost shimmed out (c.f., FIGS. 12A and 12C). Similarly, it is envisioned that $|B_1^+|$ shimming may be performed over thicker slabs and/or over other transverse, sagittal and/or coronal slices to reduce $|B_1^+|$ non-uniformity and to improve image quality.

Figure 13:
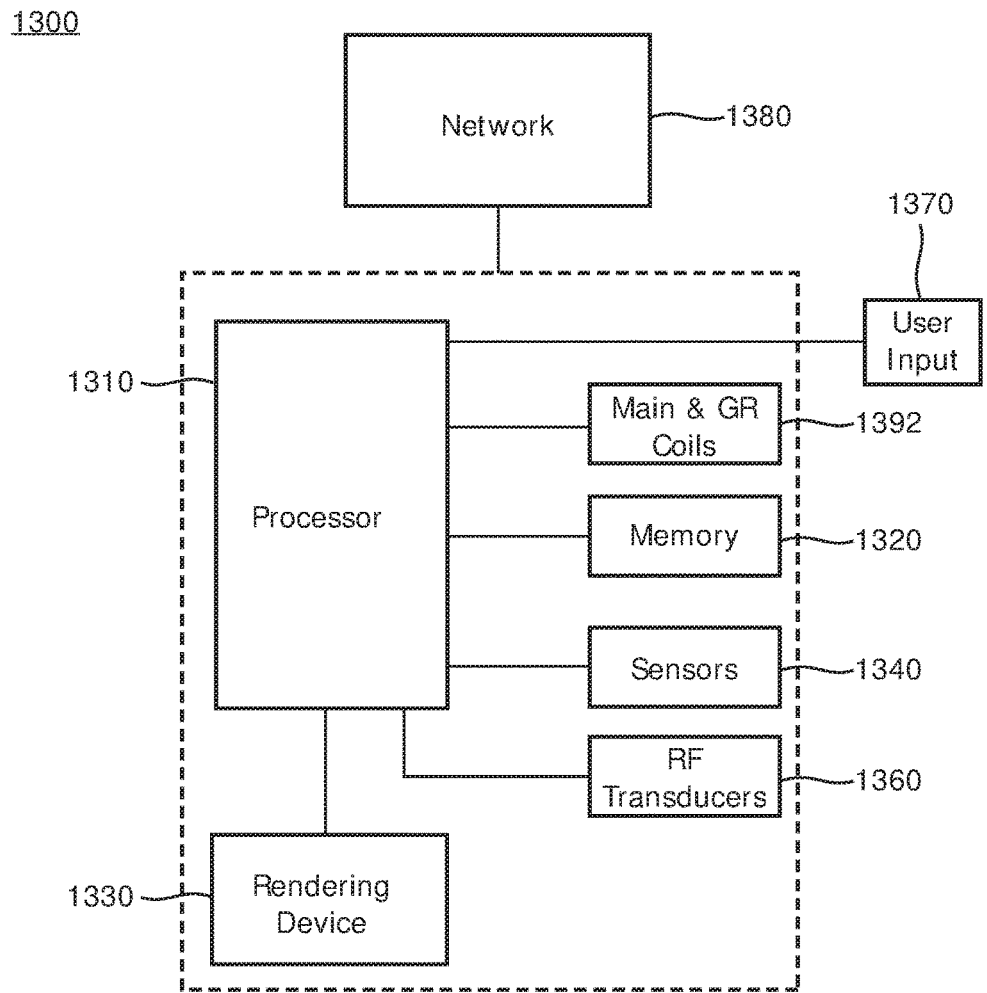
FIG. 13 shows a portion of a system in accordance with embodiments of the present system.

FIG. 13 shows a portion of a system 1300 in accordance with embodiments of the present system. For example, a portion of the present system may include a processor 1310 (e.g., a controller) operationally coupled to a memory 1320, a user interface (UI) including a rendering device such as a display 1330, sensors 1340, an RF portion 1360, magnetic coils 1392, and a user input device 1370. The memory 1320 may be any type of device for storing application data as well as other data related to the described operation. The application data and other data are received by the processor 1310 for configuring (e.g., programming) the processor 1310 to perform operation acts in accordance with the present system. The processor 1310 so configured becomes a special purpose machine particularly suited for performing in accordance with embodiments of the present system.

The operation acts may include configuring an MRI system by, for example, controlling the magnetic coils 1392, and/or the RF portion 1360 in accordance with system settings. An optional location mechanism may control a physical location (e.g., in x, y, and z axes) of a patient and/or the RF portion 1360, if desired. The RF portion 1360 may be controlled by the processor 1310 to control RF transducers such as RF transmission coils and RF reception coils, and RF states (modes) such as tune/detune and synchronization states. The RF portion 1360 may include wired-type and/or wireless-type RF portions. The magnetic coils 1392 may include main magnetic coils, gradient coils ($G_R$) (e.g., x-, y-, and z-gradient coils), optional higher-order gradient shimming coils, and may be controlled to emit a main magnetic field ($B_0$) and/or gradient fields in a desired direction and/or strength (e.g., $G_x$, $G_y$, and $G_z$). The processor 1310 may control one or more power supplies to provide power to the magnetic coils 1392 so that a desired magnetic field is emitted at a desired time. The RF portion 1360 may be controlled to transmit RF pulses and to receive acquired magnetic resonance information. A reconstructor may process received signals such as the ARF signal including the (MR) acquired magnetic resonance information and transform them (e.g., using one or more reconstruction techniques of embodiments of the present system) into content which may include image information (e.g., still or video images (e.g., video information)), data, and/or graphs that can be rendered on, for example, a UI of the system such as on the display 1330, a speaker, a printer, etc. Further, the content may then be stored in a memory of the system such as the memory 1320 for later use. Thus, operation acts may include requesting, providing, and/or rendering of content such as, for example, reconstructed image information obtained from the acquired magnetic resonance information. The processor 1310 may render the content such as video information on a UI of the system such as a display of the system. A synchronization portion may be provided to synchronize a clock of the RF portion 1360 with a system clock, if desired.

The user input 1370 may include a keyboard, a mouse, a trackball, or other device, such as a touch-sensitive display, which may be stand alone or part of a system, such as part of a personal computer, a personal digital assistant (PDA), a mobile phone (e.g., a smart phone), a monitor, a smart-terminal or dumb-terminal or other device for communicating with the processor 1310 via any operable link such as a wired and/or wireless communication link. The user input device 1370 may be operable for interacting with the processor 1310 including enabling interaction within a UI as described herein. Clearly the processor 1310, the memory 1320, display 1330, and/or user input device 1370 may all or partly be a portion of a computer system or other device such as a client and/or server.

The methods of the present system are particularly suited to be carried out by a computer software program, such program containing modules corresponding to one or more of the individual steps or acts described and/or envisioned by the present system. Such program may of course be embodied in a non-transitory computer-readable medium, such as an integrated chip, a peripheral device or memory, such as the memory 1320 or other memory coupled to the processor 1310.

The program and/or program portions contained in the memory 1320 may configure the processor 1310 to implement the methods, operational acts, and functions disclosed herein. The memories may be distributed, for example between the clients and/or servers, or local, and the processor 1310, where additional processors may be provided, may also be distributed or may be singular. The memories may be implemented as electrical, magnetic or optical memory, or any combination of these or other types of storage devices. Moreover, the term "memory" should be construed broadly enough to encompass any information able to be read from or written to an address in an addressable space accessible by the processor 1310. With this definition, information accessible through a network is still within the memory, for instance, because the processor 1310 may retrieve the information from the network for operation in accordance with the present system.

The processor 1310 is operable for providing control signals and/or performing operations in response to input signals from the user input device 1370 as well as in response to other devices of a network and executing instructions stored in the memory 1320. The processor 1310 may include one or more of a microprocessor, an application-specific or general-use integrated circuit(s), a logic device, etc. Further, the processor 1310 may be a dedicated processor for performing in accordance with the present system or may be a general-purpose processor wherein only one of many functions operates for performing in accordance with the present system. The processor 1310 may operate utilizing a program portion, multiple program segments, or may be a hardware device utilizing a dedicated or multi-purpose integrated circuit. Embodiments of the present system may provide fast imaging methods to acquire and/or reconstruct images. Suitable applications may include imaging systems such as MRI systems.

Accordingly, embodiments of the present system may provide a volume-type RF coil composed of two different coil types and with higher power efficiency than conventional RF T/R coils and may provide enhanced $B_1^+$ shimming. For example, embodiments of the present system may provide a T/R coil suitable for use at ultra-high fields such as 7T with enhanced a $B_1^+$ field distribution. This can overcome disadvantages of conventional RF T/R coils which may suffer from non-uniform a $B_1^+$ field distribution due to an increased dielectric (wavelength) effect. Further, in accordance with embodiments of the present system, an RF T/R coil driver may be provided which uses two or more independent T/R channels to drive coils formed in accordance with embodiments of the present system to improve $B_1^+$ uniformity.

Further, although embodiments of the present system may be described as operating in accordance with ultra-high-field MRI such as 7T MRI, it would be appreciated that embodiments of the present system may operate at other field strengths and/or operating frequencies.

While the present invention has been shown and described with reference to particular exemplary embodiments, it will be understood by those skilled in the art that present invention is not limited thereto, but that various changes in form and details, including the combination of various features and embodiments, may be made therein without departing from the spirit and scope of the invention.

Further variations of the present system would readily occur to a person of ordinary skill in the art and are encompassed by the following claims.

Finally, the above-discussion is intended to be merely illustrative of the present system and should not be construed as limiting the appended claims to any particular embodiment or group of embodiments. Thus, while the present system has been described with reference to exemplary embodiments, it should also be appreciated that numerous modifications and alternative embodiments may be devised by those having ordinary skill in the art without departing from the broader and intended spirit and scope of the present system as set forth in the claims that follow. In addition, the section headings included herein are intended to facilitate a review but are not intended to limit the scope of the present system. Accordingly, the specification and drawings are to be regarded in an illustrative manner and are not intended to limit the scope of the appended claims.

The section headings included herein are intended to facilitate a review but are not intended to limit the scope of the present system. Accordingly, the specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise;

h) no specific sequence of acts or steps is intended to be required unless specifically indicated;

i) the term "plurality of" an element includes two or more of the claimed element, and does not imply any particular range of number of elements; that is, a plurality of elements may be as few as two elements, and may include an immeasurable number of elements; and j) the term and/or and formatives thereof should be understood to mean that only one or more of the listed elements may need to be suitably present in the system in accordance with the claims recitation and in accordance with one or more embodiments of the present system.

The invention claimed is:

1. An ultra-high field radio-frequency (RF) coil apparatus for magnetic resonance (MR) systems, the RF coil comprising:
a ring coil comprising a loop having an opening and defining a radial axis, wherein the ring coil is structured to include a resonant mode with a sinusoidal current distribution along the ring coil;
a volume coil having opposed ends defining a length and extending through the opening of the ring coil; and
a shield situated about the ring coil and the volume coil, the volume coil having:
end coils each situated at one of the opposed ends and each comprising a loop defining a radial axis and having a plurality of coupled conductive segments, the end coils being parallel with each other and aligned so that the radial axis of each of the end coils defines a common axis, at least one of the opposed end coils having a plurality of ports (p) for receiving a first set of quadrature drive signals, and
a plurality of rungs parallel with each other and coupled to the opposed end coils,
wherein the ring coil has a plurality of ports (p') for receiving a second set of quadrature drive signals and being formed from a plurality of conductive segments capacitively coupled to each other, and
an RF controller comprising at least one controller which generates the first set of quadrature drive signals and the second set of quadrature drive signals wherein the RF controller further controls at least one of amplitude and phase of each of the first set of quadrature drive signals to perform $B_1^+$ shimming in ultra-high magnetic fields.

2. The apparatus of claim 1, wherein a reactance of each of the end coils and the ring coils are the same.

3. The apparatus of claim 1, wherein each of the end coils and ring coils has a same number of conductive segments.

4. The apparatus of claim 1, wherein the plurality of ports of the ring coil comprises two or four ports (p') each spatially distributed 90 degrees apart from each other about the radial axis of the ring coil.

5. The apparatus of claim 1, wherein the ring coil is situated at a point which is equidistant from the end coils.

6. The apparatus of claim 1, wherein each of the quadrature drive signals is generated by a corresponding independent transmit/receive (T/R) channel of a plurality of independent T/R channels, and, wherein at least three of the independent T/R channels of the plurality of independent T/R channels are controlled to perform $B_1^+$ shimming.

7. The apparatus of claim 1, wherein each of the quadrature drive signals is generated by a corresponding independent transmit receive (T/R) channel of a plurality of independent T/R channels, and wherein four of the independent T/R channels of the plurality of independent T/R channels are controlled to perform $B_1^+$ shimming.

8. A magnetic resonance (MR) system, comprising:
a volume-type radio-frequency (RF) coil assembly having an ultra-high field volume coil with a plurality of ports (p) and a ring coil with a plurality of ports (p') and being situated about the volume-type coil, wherein the ring coil is structured to include a resonant mode with a sinusoidal current distribution along the ring coil; and
at least one controller configured to selectively control a first transmit/receive (T/R) radio frequency (RF) channel to generate an output comprising RF quadrature signals to drive the volume-type coil and to selectively control a second T/R RF channel to generate an output comprising RF quadrature signals to drive the ring coil, wherein the at least one controller performs $B_1^+$ shimming by varying at least one of amplitude and phase of the RF quadrature signals of the selectively controlled first and second T/R RF channels to perform $B_1^+$ shimming in ultra-high magnetic fields.

9. The system of claim 8, wherein the volume coil and the ring coil are configured to be driven independently of each other.

10. The system of claim 8, wherein the at least one controller performs $B_1^+$ shimming by controlling the outputs of first and second T/R RF channels relative to each other.

11. The system of claim 8, wherein the at least one controller performs $B_1^+$ shimming by varying at least one of amplitude and phase of the RF quadrature signals of the selectively controlled first and second T/R RF channels.

12. The system of claim 8, wherein the at least one controller performs a multi-transmit pre-scan operation to determine $B_1^+$ shimming settings.

13. The system of claim 8, wherein the RF quadrature signals for each channel of the first and second T/R RF channels respectively comprises first through fourth signals each with a progressive phase shift.

14. A magnetic resonance imaging system comprising:
   a main magnet configured to generate an ultra-high magnetic field of at least 7 Tesla in an examination region;
   gradient coils configured to apply magnetic field gradients in the examination region;
   the magnetic resonance system of claim 8, disposed with the volume-type radio frequency (RF) coil disposed around the examination region;
   a reconstruction processor configured to reconstruct magnetic resonance signals received by the volume-type RF coil from an object in the examination region into an image of at least a portion of the object.

15. The magnetic resonance imaging system of claim 14, further including:
   a display device configured to display the reconstructed image.

16. A method of operating an ultra-high field radio-frequency (RF) coil of a magnetic resonance (MR) system, the method performed by at least one controller of the MR system and comprising an act of driving a volume-type radio-frequency (RF) coil assembly having a volume coil with a plurality of ports, and a ring coil with a plurality of ports and which is situated about the volume-type coil, wherein the ring coil is structured to include a resonant mode with a sinusoidal current distribution along the ring coil, by:
   selectively controlling a first transmit/receive (T/R) radio frequency (RF) channel to generate an output comprising a first set of RF quadrature signals and providing the generated first set of RF quadrature signals to the plurality of ports of the volume-type coil;
   selectively controlling a second T/R RF channel to generate an output comprising a second set of RF quadrature signals and providing the generated second set of RF quadrature signals to the plurality of ports of the ring coil; and
   wherein the at least one controller performs $B_1^+$ shimming by varying at least one of amplitude and phase of the RF quadrature signals of the selectively controlled first and second T/R RF channels to perform $B_1^+$ shimming in ultra-high magnetic fields.

17. The method of claim 16, wherein the volume coil and the ring coil are configured to be driven independently of each other.

18. The method of claim 16, wherein the at least one controller performs $B_1^+$ shimming by controlling the outputs of first and second T/R RF channels relative to each other.

19. A non-transitory computer-readable medium carrying software configured to control a computer processor of a magnetic resonance system to operate an ultra-high field RF coil according to the method of claim 16.

\* \* \* \* \*